(12) United States Patent  
Seki et al.

(10) Patent No.: US 11,833,551 B2  
(45) Date of Patent: Dec. 5, 2023

(54) PRE-WET MODULE, DEAERATED LIQUID CIRCULATION SYSTEM, AND PRE-WET METHOD

(71) Applicant: EBARA CORPORATION, Tokyo (JP)

(72) Inventors: Masaya Seki, Tokyo (JP); Mitsutoshi Yahagi, Tokyo (JP); Nobuya Yamada, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/839,070

(22) Filed: Jun. 13, 2022

(65) Prior Publication Data

US 2022/0379352 A1 Dec. 1, 2022

Related U.S. Application Data

(63) Continuation-in-part of application No. PCT/JP2021/020612, filed on May 31, 2021.

(30) Foreign Application Priority Data

Sep. 22, 2021 (JP) ................................. 2021-154525

(51) Int. Cl.
*B08B 3/02* (2006.01)
*C23C 18/16* (2006.01)
(Continued)

(52) U.S. Cl.
CPC ............ *B08B 3/022* (2013.01); *C23C 18/163* (2013.01); *C23C 18/18* (2013.01); *H01L 21/68764* (2013.01)

(58) Field of Classification Search
CPC ................................................... B08B 3/022
See application file for complete search history.

(56) References Cited

U.S. PATENT DOCUMENTS

2015/0233007 A1 8/2015 Kuribayashi et al.
2018/0179656 A1 6/2018 Okuzono et al.
(Continued)

FOREIGN PATENT DOCUMENTS

JP S38-007417 Y1 4/1963
JP S45-031726 B 10/1970
(Continued)

*Primary Examiner* — Jason Y Ko
(74) *Attorney, Agent, or Firm* — BakerHostetler

(57) ABSTRACT

A preprocess is efficiently performed on a substrate. A pre-wet module 200 includes a deaeration tank 210, a processing device 258, a substrate holder 220, and a drive mechanism 230. The deaeration tank 210 is configured to house a deaerated liquid. The processing device 258 includes a nozzle 268 configured to supply a cleaning liquid to a surface to be processed of a substrate having the surface to be processed facing upward. The substrate holder 220 is disposed between the deaeration tank 210 and the processing device 258. The substrate holder 220 includes a first holding member 222 configured to hold a first substrate and a second holding member 224 configured to hold a second substrate. The drive mechanism 230 is configured to rotate and move up and down the substrate holder 220. The drive mechanism 230 includes a rotation mechanism 240 and an elevating mechanism 248. The rotation mechanism 240 is configured to rotate the substrate holder 220 between a first state where a surface to be processed of the first substrate is opposed to a deaerated liquid in the deaeration tank 210 and a second state where a surface to be processed of the second substrate is opposed to the deaerated liquid in the deaeration tank. The elevating mechanism 248 is configured to move up and down the substrate holder 220.

14 Claims, 19 Drawing Sheets

(51) Int. Cl.
*C23C 18/18* (2006.01)
*H01L 21/687* (2006.01)

(56) References Cited

U.S. PATENT DOCUMENTS

| | | |
|---|---|---|
| 2018/0282892 A1 | 10/2018 | Fujikata et al. |
| 2021/0062354 A1 | 3/2021 | Fujikata et al. |

FOREIGN PATENT DOCUMENTS

| | | |
|---|---|---|
| JP | S47-003521 B | 1/1972 |
| JP | S51-008898 Y1 | 3/1976 |
| JP | 2002-097599 A | 4/2002 |
| JP | 2015-151624 A | 8/2015 |
| JP | 2018-104799 A | 7/2018 |
| KR | 2017-0027746 A | 3/2017 |
| KR | 2018-0111509 A | 10/2018 |

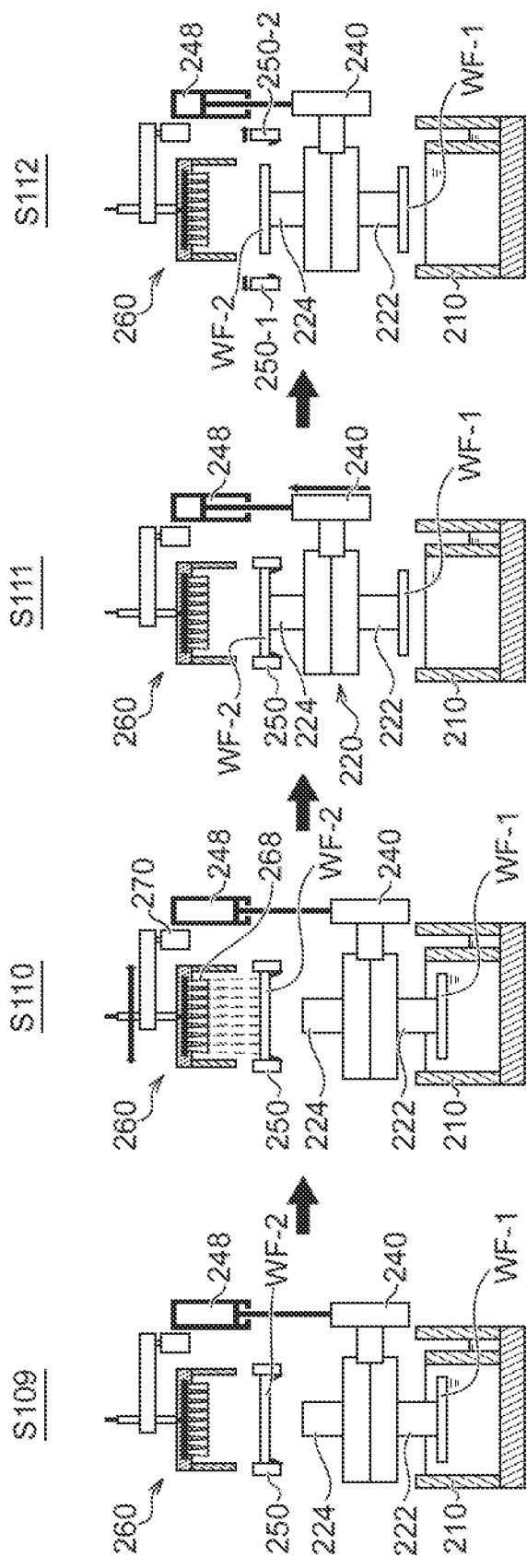

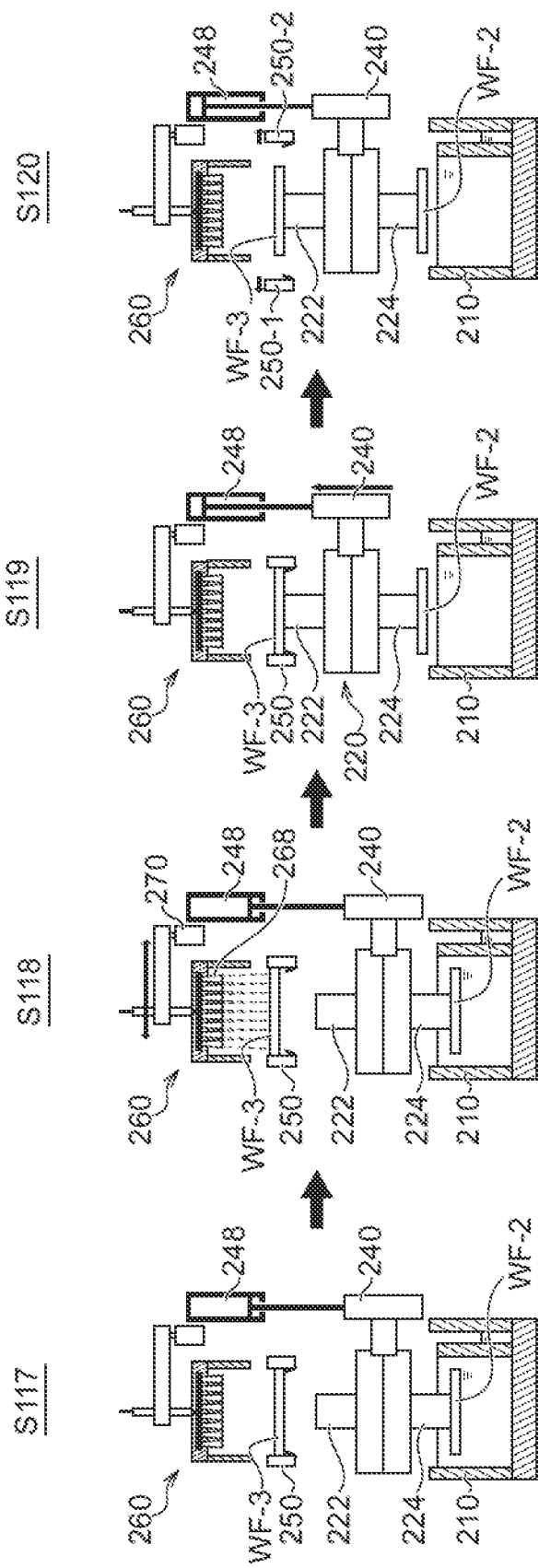

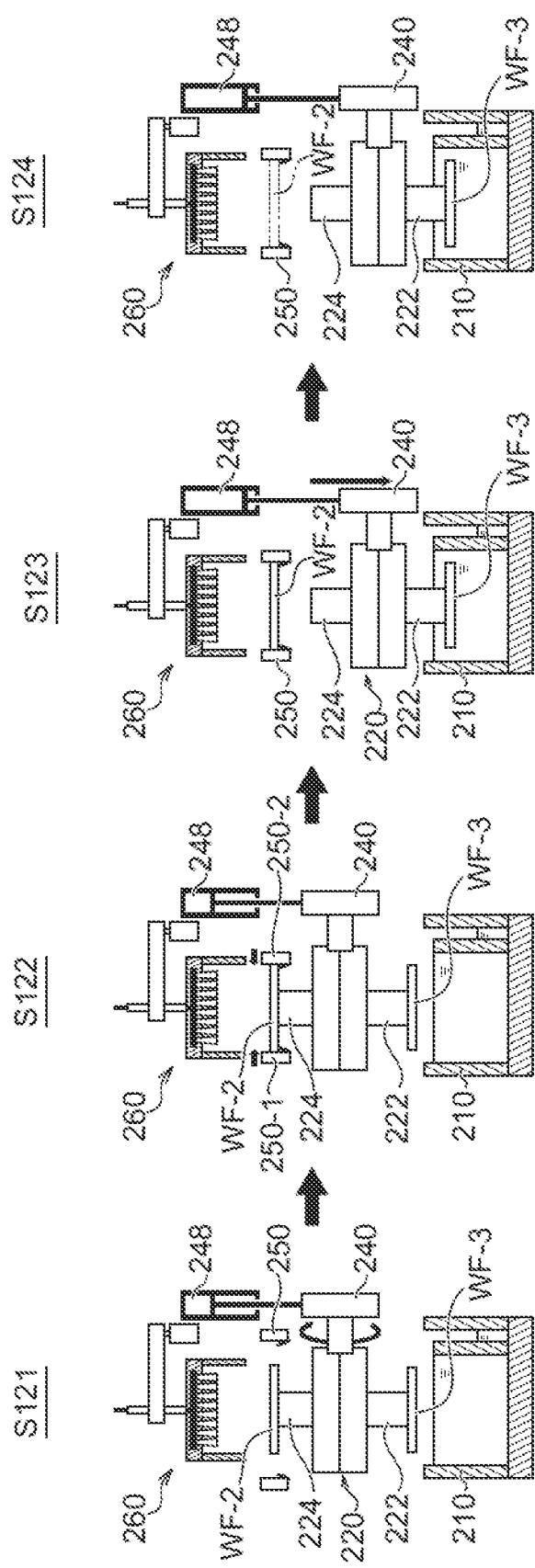

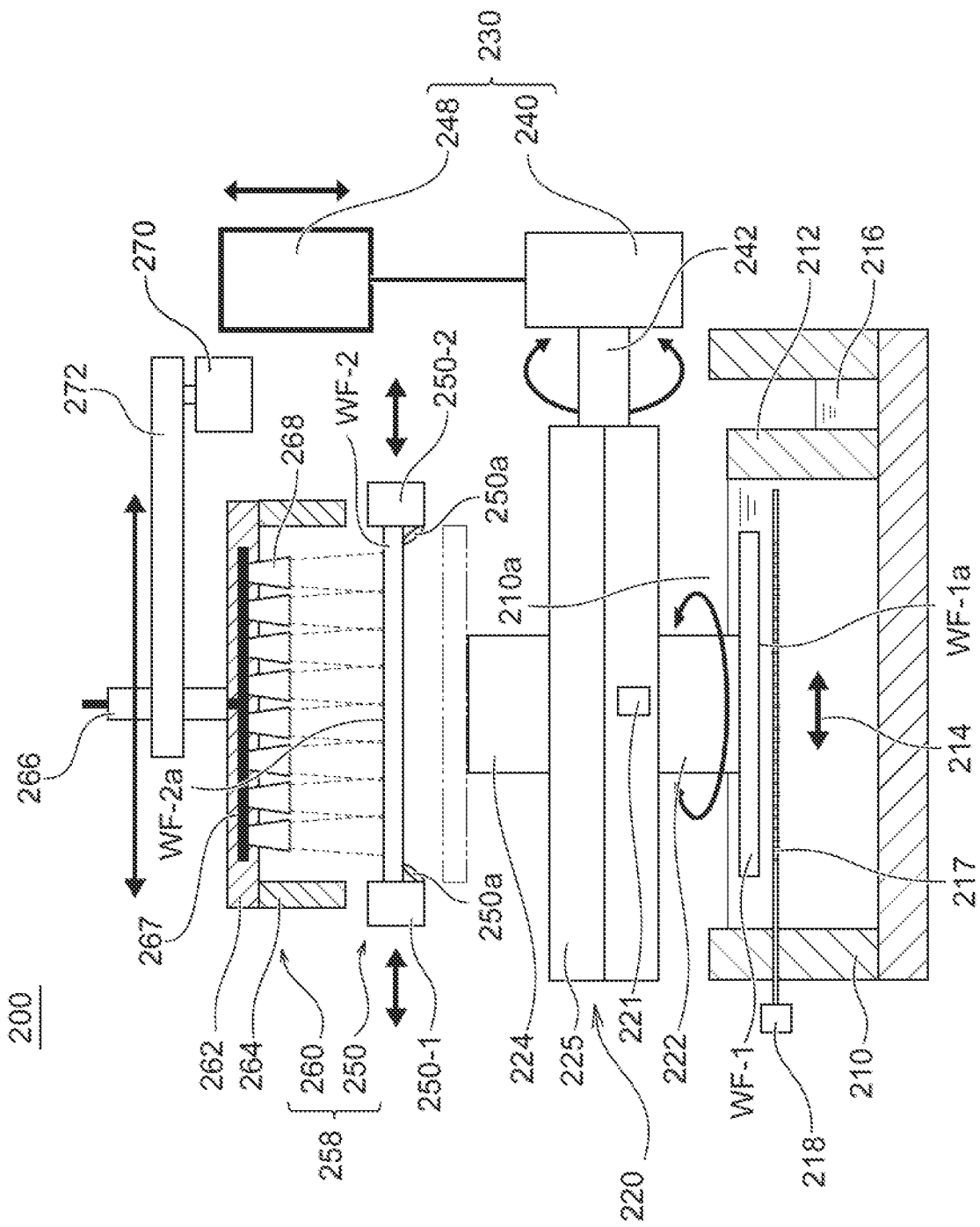

PRE-WET MODULE, DEAERATED LIQUID CIRCULATION SYSTEM, AND PRE-WET METHOD

This application relates to a pre-wet module, a deaerated liquid circulation system, and a pre-wet method. This application claims priority based on International Application No. PCT/JP2021/020612 filed on May 31, 2021 and Japanese Patent Application No. 2021-154525 filed on Sep. 22, 2021. The entire disclosure of International Application No. PCT/JP2021/020612 and Japanese Patent Application No. 2021-154525, including the specifications, the claims, the drawings, and the abstracts is incorporated in this application by reference in its entirety.

TECHNICAL FIELD

Background Art

A plating apparatus for performing a plating process on a substrate (for example, a semiconductor wafer) includes a pre-wet module that performs various kinds of preprocesses, such as a deaeration process, on the substrate, and a plating module that performs the plating process on the substrate on which the preprocess has been performed.

For example, PTL 1 discloses a pre-wet module that performs a preprocess by arranging a holder holding a substrate in a pre-wet tank, and, while vacuum-drawing a space to which a surface to be processed of the substrate is exposed, supplying a pre-wet liquid to the space.

CITATION LIST

Patent Literature

PTL 1: Japanese Unexamined Patent Application Publication No. 2018-104799

SUMMARY OF INVENTION

Technical Problem

However, the related art has a room for improvement in efficiently performing the preprocesses on the substrate.

That is, since the related art is configured to perform the preprocess in the pre-wet tank while holding one substrate by the substrate holder, the preprocess of the substrate is sequentially performed one by one in the pre-wet module. Therefore, for example, during the preprocess of one substrate, the pre-wet module is used exclusively for the substrate, and a subsequent substrate can be loaded in the pre-wet module and subjected to the preprocess only after the one substrate is unloaded from the pre-wet module. Consequently, the related art has a room for improvement in improving a throughput of the pre-wet module.

Therefore, it is an object of this application to efficiently perform a preprocess on a substrate.

Solution to Problem

According to one embodiment, a pre-wet module that includes a deaeration tank, a processing device, a substrate holder, and a drive mechanism is disclosed. The deaeration tank is configured to house a deaerated liquid. The processing device includes a nozzle configured to supply a cleaning liquid to a surface to be processed of a substrate having the surface to be processed facing upward. The substrate holder is disposed between the deaeration tank and the processing device. The substrate holder includes a first holding member configured to hold a first substrate and a second holding member configured to hold a second substrate. The drive mechanism is configured to rotate and move up and down the substrate holder. The drive mechanism includes a rotation mechanism and an elevating mechanism. The rotation mechanism is configured to rotate the substrate holder between a first state where a surface to be processed of the first substrate is opposed to a deaerated liquid in the deaeration tank and a second state where a surface to be processed of the second substrate is opposed to the deaerated liquid in the deaeration tank. The elevating mechanism is configured to move up and down the substrate holder.

BRIEF DESCRIPTION OF DRAWINGS

FIG. 4C is a drawing schematically illustrating the pre-wet method using the pre-wet module of the one embodiment;

FIG. 4E is a drawing schematically illustrating the pre-wet method using the pre-wet module of the one embodiment;

FIG. 4F is a drawing schematically illustrating the pre-wet method using the pre-wet module of the one embodiment;

FIG. 11 is a vertical cross-sectional view schematically illustrating a configuration of a pre-wet module of one embodiment;

DESCRIPTION OF EMBODIMENTS

Figure 1:
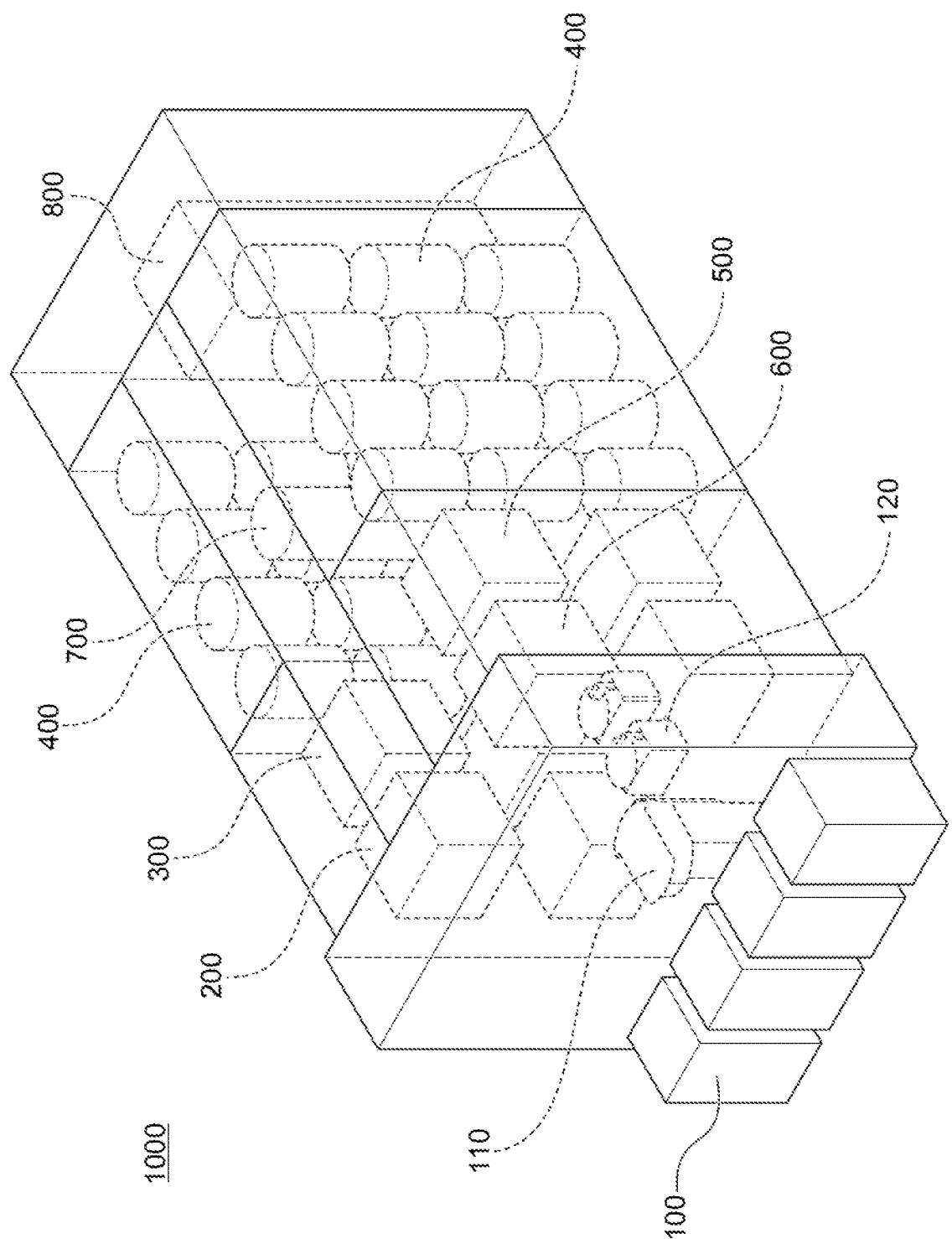
FIG. 1 is a perspective view illustrating an overall configuration of a plating apparatus of this embodiment.

The following will describe embodiments of the present invention with reference to the drawings. In the drawings described below, the same reference numerals are attached to the same or equivalent components to omit the overlapping descriptions.

<Overall Configuration of Plating Apparatus>

Figure 2:
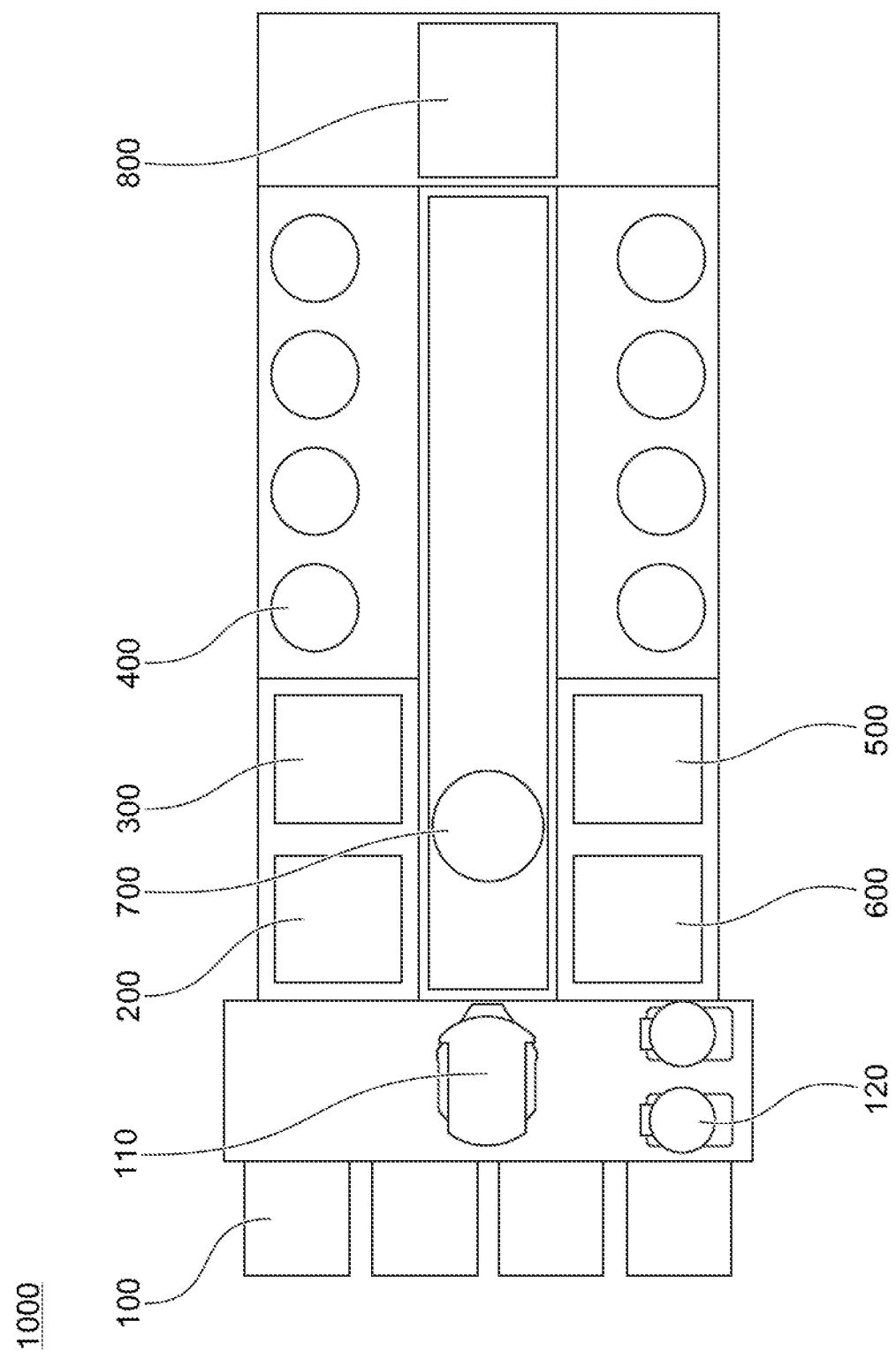
FIG. 2 is a plan view illustrating the overall configuration of the plating apparatus of this embodiment.

FIG. 1 is a perspective view illustrating the overall configuration of the plating apparatus of this embodiment. FIG. 2 is a plan view illustrating the overall configuration of the plating apparatus of this embodiment. As illustrated in FIGS. 1 and 2, a plating apparatus 1000 includes load ports 100, a transfer robot 110, aligners 120, pre-wet modules 200, pre-soak modules 300, plating modules 400, cleaning modules 500, spin rinse dryers 600, a transfer device 700, and a control module 800.

The load port 100 is a module for loading a substrate housed in a cassette, such as a FOUP, (not illustrated) to the plating apparatus 1000 and unloading the substrate from the plating apparatus 1000 to the cassette. While the four load ports 100 are arranged in the horizontal direction in this embodiment, the number of load ports 100 and arrangement of the load ports 100 are arbitrary. The transfer robot 110 is a robot for transferring the substrate that is configured to grip or release the substrate between the load port 100, the aligner 120, and the transfer device 700. The transfer robot 110 and the transfer device 700 can perform delivery and receipt of the substrate via a temporary placement table (not illustrated) to grip or release the substrate between the transfer robot 110 and the transfer device 700.

The aligner 120 is a module for adjusting a position of an orientation flat, a notch, and the like of the substrate in a predetermined direction. While the two aligners 120 are disposed to be arranged in the horizontal direction in this embodiment, the number of aligners 120 and arrangement of the aligners 120 are arbitrary. The pre-wet module 200 wets a surface to be plated of the substrate before a plating process with a process liquid, such as pure water or deaerated water, to replace air inside a pattern formed on the surface of the substrate with the process liquid. The pre-wet module 200 is configured to perform a pre-wet process to facilitate supplying the plating solution to the inside of the pattern by replacing the process liquid inside the pattern with a plating solution during plating. While the two pre-wet modules 200 are disposed to be arranged in the vertical direction in this embodiment, the number of pre-wet modules 200 and arrangement of the pre-wet modules 200 are arbitrary.

For example, the pre-soak module 300 is configured to remove an oxidized film having a large electrical resistance present on a surface of a seed layer formed on the surface to be plated of the substrate before the plating process by etching with a process liquid, such as sulfuric acid and hydrochloric acid, and perform a pre-soak process that cleans or activates a surface of a plating base layer. While the two pre-soak modules 300 are disposed to be arranged in the vertical direction in this embodiment, the number of pre-soak modules 300 and arrangement of the pre-soak modules 300 are arbitrary. The plating module 400 performs the plating process on the substrate. There are two sets of the 12 plating modules 400 arranged by three in the vertical direction and by four in the horizontal direction, and the total 24 plating modules 400 are disposed in this embodiment, but the number of plating modules 400 and arrangement of the plating modules 400 are arbitrary.

The cleaning module 500 is configured to perform a cleaning process on the substrate to remove the plating solution or the like left on the substrate after the plating process. While the two cleaning modules 500 are disposed to be arranged in the vertical direction in this embodiment, the number of cleaning modules 500 and arrangement of the cleaning modules 500 are arbitrary. The spin rinse dryer 600 is a module for rotating the substrate after the cleaning process at high speed and drying the substrate. While the two spin rinse dryers are disposed to be arranged in the vertical direction in this embodiment, the number of spin rinse dryers and arrangement of the spin rinse dryers are arbitrary. The transfer device 700 is a device for transferring the substrate between the plurality of modules inside the plating apparatus 1000. The control module 800 is configured to control the plurality of modules in the plating apparatus 1000 and can be configured of, for example, a general computer including input/output interfaces with an operator or a dedicated computer.

An example of a sequence of the plating processes by the plating apparatus 1000 will be described. First, the substrate housed in the cassette is loaded on the load port 100. Subsequently, the transfer robot 110 grips the substrate from the cassette at the load port 100 and transfers the substrate to the aligners 120. The aligner 120 adjusts the position of the orientation flat, the notch, or the like of the substrate in the predetermined direction. The transfer robot 110 grips or releases the substrate whose direction is adjusted with the aligners 120 to the transfer device 700.

The transfer device 700 transfers the substrate received from the transfer robot 110 to the pre-wet module 200. The pre-wet module 200 performs the pre-wet process on the substrate. The transfer device 700 transfers the substrate on which the pre-wet process has been performed to the pre-soak module 300. The pre-soak module 300 performs the pre-soak process on the substrate. The transfer device 700 transfers the substrate on which the pre-soak process has been performed to the plating module 400. The plating module 400 performs the plating process on the substrate.

The transfer device 700 transfers the substrate on which the plating process has been performed to the cleaning module 500. The cleaning module 500 performs the cleaning process on the substrate. The transfer device 700 transfers the substrate on which the cleaning process has been performed to the spin rinse dryer 600. The spin rinse dryer 600 performs the drying process on the substrate. The transfer device 700 grips or releases the substrate on which the drying process has been performed to the transfer robot 110. The transfer robot 110 transfers the substrate received from the transfer device 700 to the cassette at the load port 100. Finally, the cassette housing the substrate is unloaded from the load port 100.

<Configuration of Pre-Wet Module>

Next, the configuration of the pre-wet module 200 will be described. Since the two pre-wet modules 200 according to this embodiment have the same configurations, only one pre-wet module 200 will be described.

Figure 3:
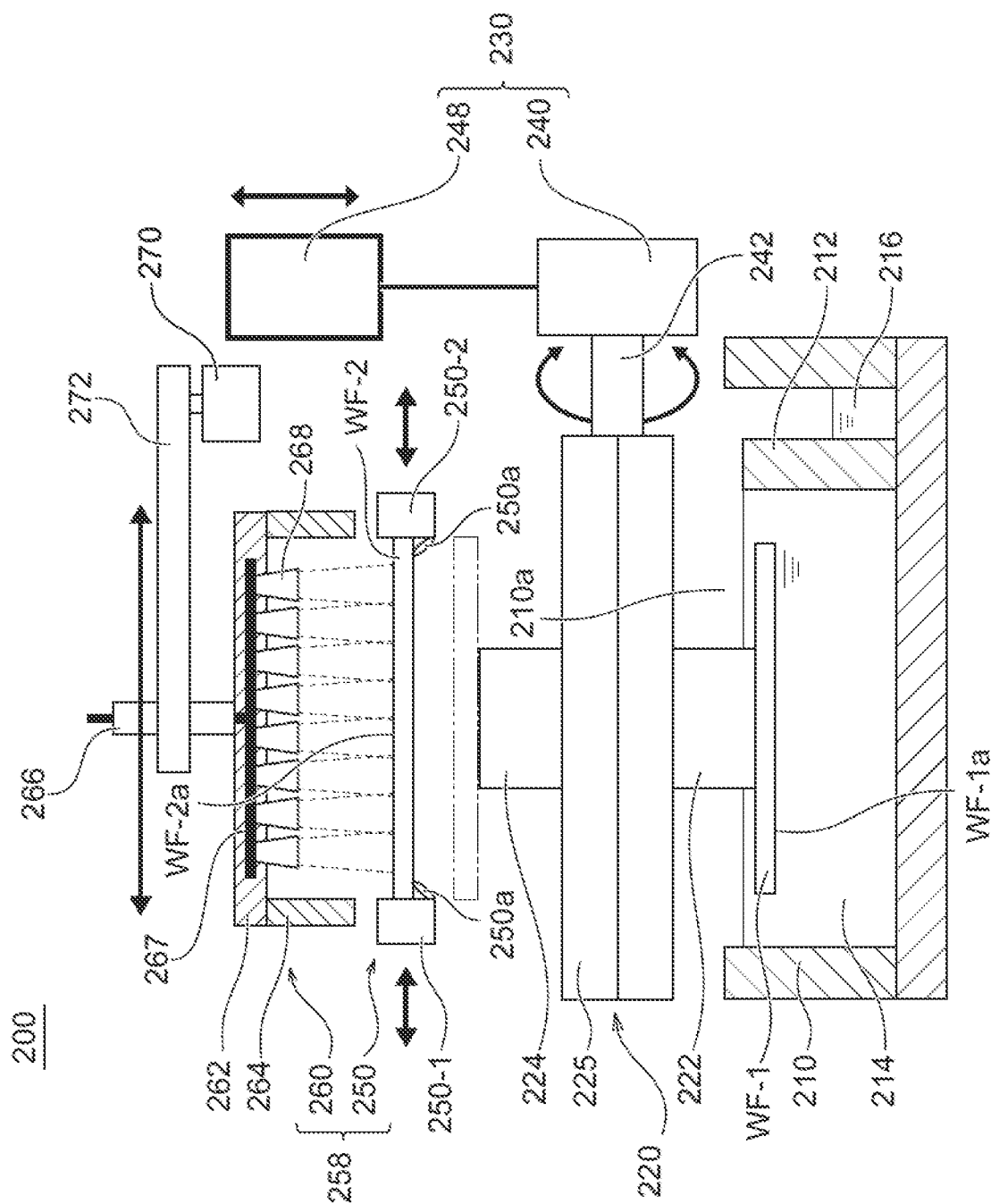
FIG. 3 is a vertical cross-sectional view schematically illustrating a configuration of a pre-wet module of one embodiment.

FIG. 3 is a vertical cross-sectional view schematically illustrating the configuration of the pre-wet module of one embodiment. As illustrated in FIG. 3, the pre-wet module 200 includes a deaeration tank 210 configured to house a deaerated liquid (for example, deaerated water). The deaeration tank 210 is open at the top surface, and has a shape allowing storage of the deaerated liquid. A space inside the deaeration tank 210 is partitioned into two regions by a partition plate 212 extending in the vertical direction. Therefore, the inside of the deaeration tank 210 is partitioned into a deaeration region 214 for performing a deaeration process on a substrate WF and an overflow region 216 configured to store the deaerated liquid overflowing from the deaeration region 214.

The pre-wet module 200 includes a substrate holder 220 disposed above the deaeration tank 210. The substrate holder 220 is configured to hold the substrate WF as a target of a preprocess. The substrate holder 220 includes a column-shaped first holding member 222 configured to hold a first substrate WF-1 having a circular plate shape, and a column-shaped second holding member 224 configured to hold a second substrate WF-2 having a circular plate shape. The first holding member 222 and the second holding member 224 are each configured to hold a back side of a surface to be processed of a substrate by vacuum suction or the like. In this embodiment, the first holding member 222 and the second holding member 224 are configured to hold the first substrate WF-1 and the second substrate WF-2 such that a surface to be processed WF-1a of the first substrate WF-1 and a surface to be processed WF-2a of the second substrate WF-2 face mutually opposite sides (in the state of FIG. 3, mutually opposite sides in the vertical direction). In this embodiment, while the terms such as "first substrate WF-1" and "second substrate WF-2" are used, this is simply for the distinction of different substrates, and does not indicate the order of the process.

The pre-wet module 200 includes a drive mechanism 230 configured to drive the substrate holder 220. The drive mechanism 230 drives the substrate holder 220 so as to sequentially immerse the first substrate WF-1 and the second substrate WF-2 in the deaerated liquid in the deaeration tank 210. The drive mechanism 230 specifically includes a rotation mechanism 240 configured to rotate the substrate holder 220, and an elevating mechanism 248 configured to move up and down the substrate holder 220.

The rotation mechanism 240 is configured to rotate the substrate holder 220 about an axis of a shaft 242 extending from the substrate holder 220 in the horizontal direction. Thus, the rotation mechanism 240 is configured to rotate the substrate holder 220 between a first state where the surface to be processed WF-1a of the first substrate WF-1 is opposed to the deaerated liquid in the deaeration tank 210 and a second state where the surface to be processed WF-2a of the second substrate WF-2 is opposed to the deaerated liquid in the deaeration tank 210. The rotation mechanism 240 can be achieved by a known mechanism, such as a motor.

The elevating mechanism 248 can immerse the first substrate WF-1 in the deaerated liquid by moving down the substrate holder 220 from the first state, and can immerse the second substrate WF-2 in the deaerated liquid by moving down the substrate holder 220 from the second state. The elevating mechanism 248 can be achieved by a known mechanism, such as a motor. While the example in which the drive mechanism 230 includes the rotation mechanism 240 and the elevating mechanism 248 has been described in this embodiment, the configuration is not limited thereto.

The pre-wet module 200 includes a processing device 258 configured such that when one of the first substrate WF-1 and the second substrate WF-2 is immersed in the deaerated liquid in the deaeration tank 210, the processing device 258 performs a predetermined process on the other substrate. In this embodiment, the processing device 258 includes a substrate station 250 disposed above the substrate holder 220 and a cleaning device 260 disposed above the substrate station 250.

The substrate station 250 is a member for holding the substrate when the substrate is gripped or released with the transfer device 700, and when a cleaning process described later is performed on the substrate. The substrate station 250 includes a first arm member 250-1 and a second arm member 250-2 for holding the back side of the surface to be processed of the substrate. The first arm member 250-1 and the second arm member 250-2 each include a protrusion member 250a for holding an outer edge of the back side of the surface to be processed of the substrate. The first arm member 250-1 and the second arm member 250-2 are disposed to be separated and arranged in the horizontal direction. The first arm member 250-1 and the second arm member 250-2 are movable in a mutually approaching direction and a direction separated from one another. The first arm member 250-1 and the second arm member 250-2 are configured to hold the substrate at substrate holding positions where the first arm member 250-1 and the second arm member 250-2 are mutually approached.

The cleaning device 260 includes a circular plate-shaped ceiling member 262 disposed to be opposed to the substrate held by the substrate station 250, a pipe-shaped side wall member 264 mounted to an outer edge of a lower surface of the ceiling member 262, and a plurality of nozzles 268 mounted to the lower surface of the ceiling member 262. A shaft 266 extending in the vertical direction is mounted to the center of an upper surface of the ceiling member 262. A flow passage 267 through which a cleaning liquid (for example, pure water) flows is formed in the shaft 266 and the ceiling member 262, and the flow passage 267 communicates with the plurality of nozzles 268. The plurality of nozzles 268 are configured to supply the cleaning liquid transmitted from a cleaning liquid source (not illustrated) via the flow passage 267 to the surface to be processed of the substrate held by the substrate station 250. The pre-wet module 200 includes a horizontal drive member 270 for driving the cleaning device 260 in the horizontal direction. The horizontal drive member 270 moves the cleaning device 260 in the horizontal direction via a shaft 272 that is secured to the shaft 266 and extends in the horizontal direction. Thus, the cleaning device 260 can clean the whole surface to be processed of the substrate. The horizontal drive member 270 can be achieved by a known mechanism, such as a motor.

In the example of FIG. 3, the plurality of nozzles 268 are configured to supply the cleaning liquid to the surface to be processed WF-2a of the second substrate WF-2 having the surface to be processed WF-2a held so as to face upward in the vertical direction when the first substrate WF-1 is immersed in the deaerated liquid in the deaeration tank 210. While the example in which the cleaning process is performed on the substrate held by the substrate station 250 has been described in this embodiment, the configuration is not limited thereto, and the cleaning process may be performed on a substrate (substrate held such that a surface to be processed faces upward in the vertical direction) held by the first holding member 222 or the second holding member 224.

The substrate holder 220 includes a shielding member 225 disposed between the plurality of nozzles 268 and the deaeration tank 210. The shielding member 225 is a circular plate-shaped member that has an outer edge larger than an opening 210a (opening of an upper portion of the deaeration region 214) formed in an upper portion of the deaeration tank 210 and is configured to shield between the plurality of nozzles 268 and the opening 210a. By disposing the shielding member 225, the cleaning liquid supplied from the plurality of nozzles 268 can be prevented from dropping in the deaeration tank 210 (deaeration region 214).

In the pre-wet module 200 of this embodiment, the substrate holder 220 includes the first holding member 222 and the second holding member 224, and the drive mechanism 230 is configured to drive the substrate holder 220 so as to sequentially immerse the first substrate WF-1 and the second substrate WF-2 in the deaerated liquid in the deaeration tank 210. Accordingly, the pre-wet module 200 can concurrently perform different processes (for example, the cleaning process and the deaeration process) on the first substrate WF-1 and the second substrate WF-2 in the pre-wet module 200. Therefore, according to this embodiment, the preprocess can be efficiently performed on the substrate, thereby allowing improving a throughput of the pre-wet module 200.

While the substrate station 250 and the cleaning device 260 have been described as the example of the processing device 258 for the process concurrently performed with the deaeration process in this embodiment, the processing device is not limited thereto. For example, in a subsequent plating process in the pre-wet module 200, since a power feeding contact point contacts an outer edge portion of the surface to be processed of the substrate, the power feed distribution on the substrate becomes uneven when the outer edge portion of the surface to be processed is wet, thus possibly resulting in unevenness of plating film thickness formed by the plating process. Therefore, the processing device 258 may be a drying device configured to dry the outer edge portion of the surface to be processed of the substrate after the deaeration process. The processing device 258 may be a surface reforming device configured to perform a UV treatment or a plasma treatment on the surface to be processed to reform the surface to be processed of the substrate before the deaeration process to be hydrophilic. Furthermore, the pre-wet module 200 does not need to include the processing device, such as the cleaning device 260, the substrate station 250, the drying device, or the surface reforming device. In this case, for example, concurrently with the deaeration process of the first substrate, a process to hold the second substrate by the second holding member 224 (substrate grip or release process) can be performed. Consequently, since the deaeration process can be quickly performed on the second substrate after the end of the deaeration process of the first substrate, the throughput of the pre-wet module 200 can be improved compared with the related art in which the pre-wet module is used exclusively for one substrate.

Figure 4A:
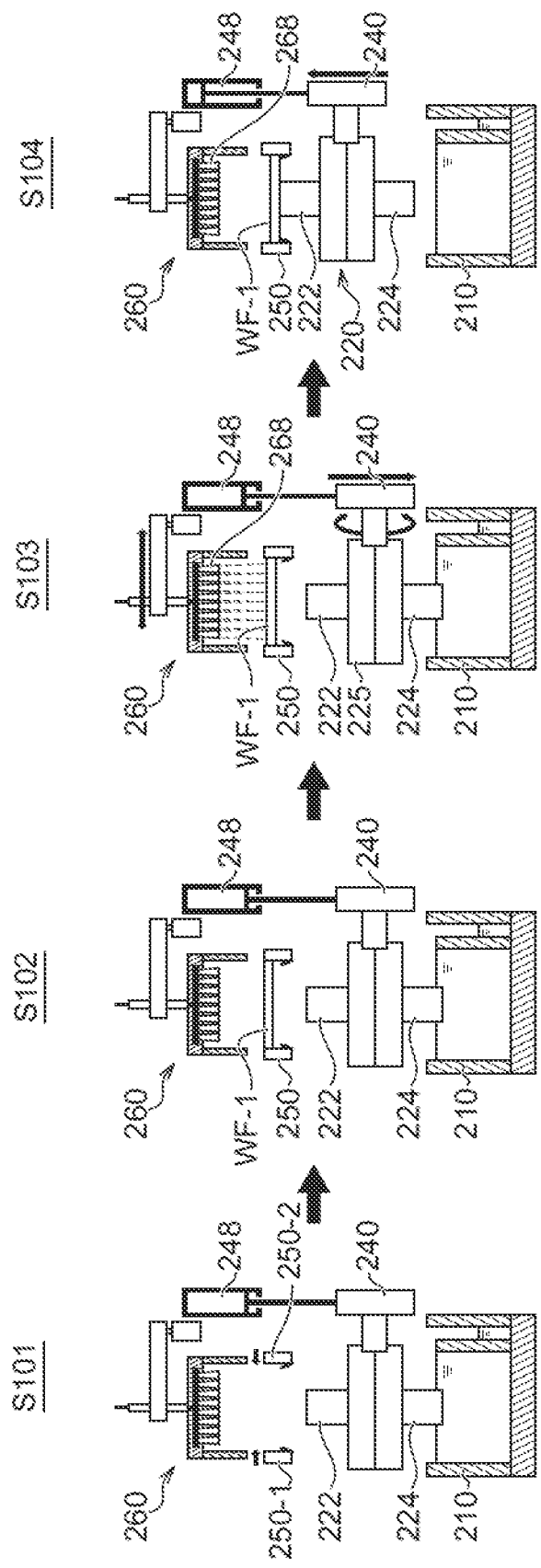
FIG. 4A is a drawing schematically illustrating a pre-wet method using a pre-wet module of one embodiment.

The following will describe a pre-wet method of this embodiment. FIG. 4A to FIG. 4F are drawings schematically illustrating a pre-wet method using a pre-wet module of one embodiment. As illustrated in FIG. 4A, the pre-wet method moves the first arm member 250-1 and the second arm member 250-2 of the substrate station 250 close to one another to the substrate holding positions (Step 101). Subsequently, the pre-wet method holds the first substrate WF-1 loaded to the pre-wet module 200 by the transfer device 700 by the substrate station 250 (Step 102).

Subsequently, the pre-wet method cleans the surface to be processed of the first substrate WF-1 held by the substrate station 250 using the cleaning device 260 (Step 103). Subsequently, the pre-wet method holds the first substrate WF-1 by moving up the substrate holder 220 using the elevating mechanism 248, bringing the first holding member 222 into contact with the back side of the surface to be processed of the first substrate WF-1, and vacuum-suctioning the back side of the surface to be processed (Step 104).

Figure 4B:
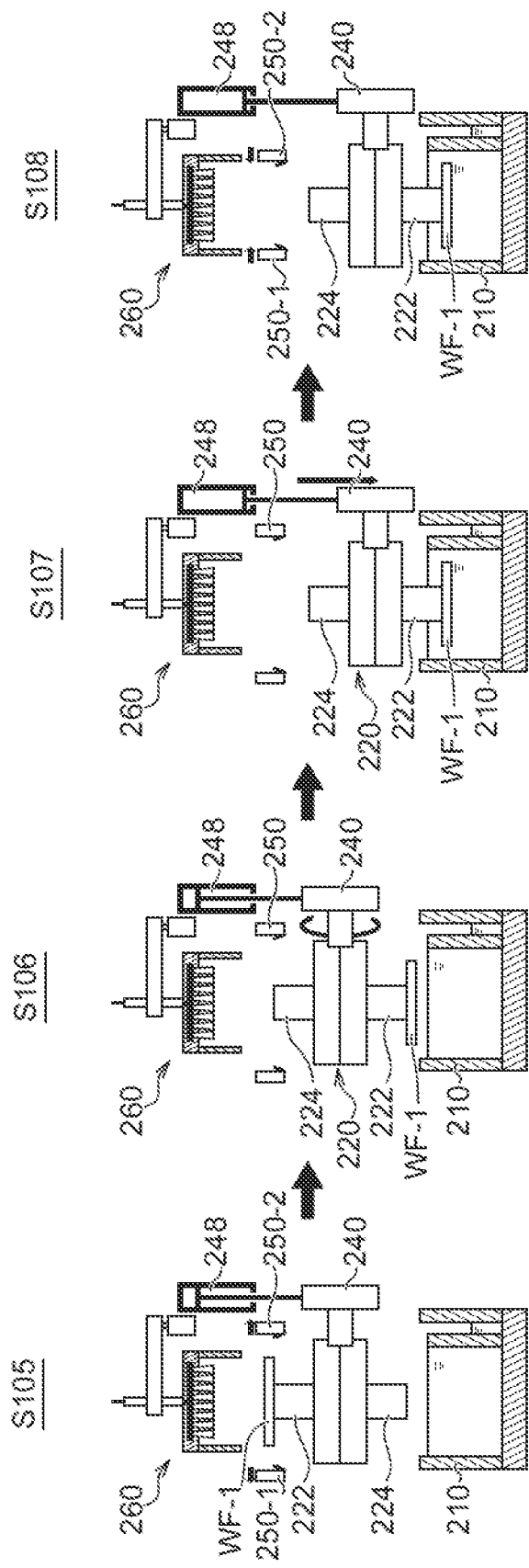
FIG. 4B is a drawing schematically illustrating the pre-wet method using the pre-wet module of the one embodiment.

Subsequently, as illustrated in FIG. 4B, the pre-wet method moves the first arm member 250-1 and the second arm member 250-2 of the substrate station 250 away from one another (Step 105). Subsequently, the pre-wet method rotates the substrate holder 220 by 180 degrees using the rotation mechanism 240 so as to turn the substrate holder 220 upside down (Step 106). Subsequently, the pre-wet method moves down the substrate holder 220 using the elevating mechanism 248 to immerse the first substrate WF-1 held by the first holding member 222 in the deaerated liquid housed in the deaeration tank 210, and performs the deaeration process (First Deaeration Step 107). Subsequently, the pre-wet method moves the first arm member 250-1 and the second arm member 250-2 of the substrate station 250 close to one another to the substrate holding positions (Step 108).

Subsequently, as illustrated in FIG. 4C, the pre-wet method holds the second substrate WF-2 loaded to the pre-wet module 200 by the transfer device 700 by the substrate station 250 concurrently with the performance of First Deaeration Step 107 (Step 109). Subsequently, the pre-wet method performs a predetermined process on the second substrate WF-2 held by the second holding member 224 in the subsequent process concurrently with the performance of First Deaeration Step 107 (First Processing Step 110). First Processing Step 110 specifically includes a cleaning step of supplying the cleaning liquid to the surface to be processed of the second substrate WF-2 (substrate held such that the surface to be processed faces upward in the vertical direction) held by the substrate station 250 using the cleaning device 260. Subsequently, the pre-wet method holds the second substrate WF-2 by moving up the substrate holder 220 using the elevating mechanism 248, bringing the second holding member 224 into contact with the back side of the surface to be processed of the second substrate WF-2, and vacuum-suctioning the back side of the surface to be processed (Step 111). Subsequently, the pre-wet method moves the first arm member 250-1 and the second arm member 250-2 of the substrate station 250 away from one another (Step 112).

Figure 4D:
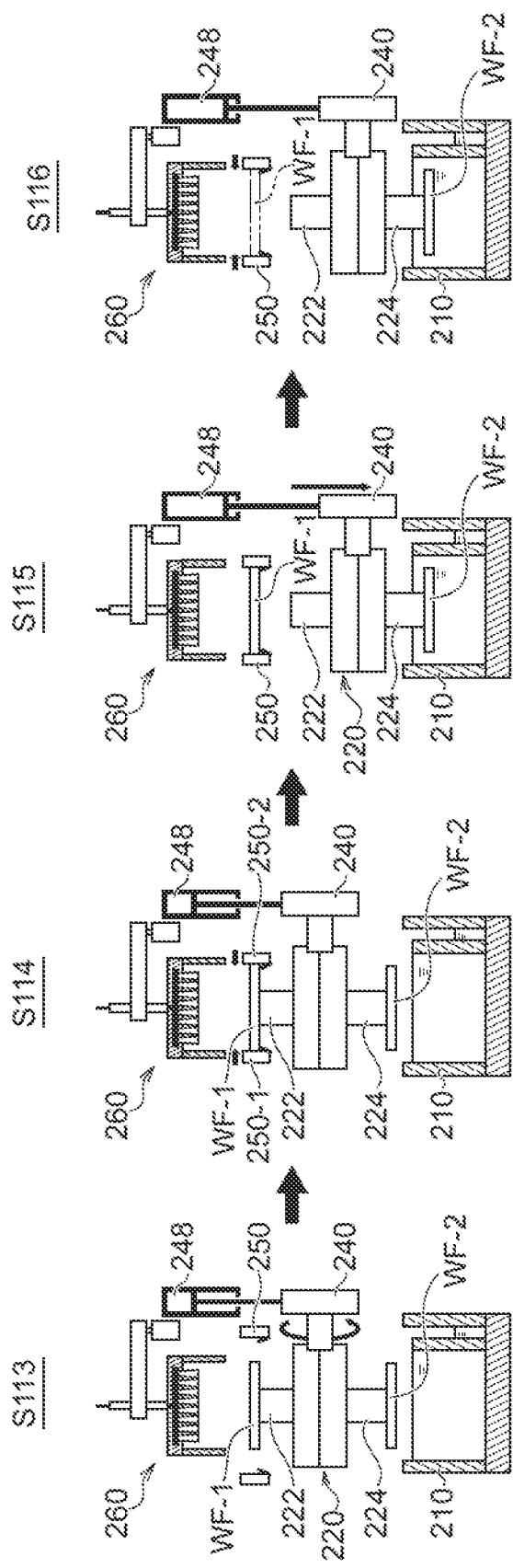
FIG. 4D is a drawing schematically illustrating the pre-wet method using the pre-wet module of the one embodiment.

Subsequently, as illustrated in FIG. 4D, the pre-wet method rotates the substrate holder 220 by 180 degrees (turns upside down) using the rotation mechanism 240 such that the surface to be processed of the second substrate WF-2 held by the second holding member 224 is opposed to the deaerated liquid housed in the deaeration tank 210 (Rotation Step 113). Subsequently, the pre-wet method moves the first arm member 250-1 and the second arm member 250-2 of the substrate station 250 close to one another to the substrate holding positions, thus holding the first substrate WF-1 by the substrate station 250 (Step 114). Subsequently, the pre-wet method moves down the substrate holder 220 using the elevating mechanism 248 to immerse the second substrate WF-2 held by the second holding member 224 in the deaerated liquid housed in the deaeration tank 210, and performs the deaeration process (Second Deaeration Step 115). Subsequently, the pre-wet method unloads the first substrate WF-1 held by the substrate station 250 using the transfer device 700 (Step 116).

Subsequently, as illustrated in FIG. 4E, the pre-wet method holds a third substrate WF-3 loaded to the pre-wet module 200 by the transfer device 700 by the substrate station 250 concurrently with the performance of Second Deaeration Step 115 (Step 117). Subsequently, the pre-wet method performs a predetermined process on the third substrate WF-3 held by the first holding member 222 in the subsequent process concurrently with the performance of Second Deaeration Step 115 (Second Processing Step 118). Second Processing Step 118 specifically includes a cleaning step of supplying the cleaning liquid to the surface to be processed of the third substrate WF-3 (substrate held such that the surface to be processed faces upward in the vertical direction) held by the substrate station 250 using the cleaning device 260. Subsequently, the pre-wet method holds the third substrate WF-3 by moving up the substrate holder 220 using the elevating mechanism 248, bringing the first holding member 222 into contact with the back side of the surface to be processed of the third substrate WF-3, and vacuum-suctioning the back side of the surface to be processed (Step 119). Subsequently, the pre-wet method moves the first arm member 250-1 and the second arm member 250-2 of the substrate station 250 away from one another (Step 120).

Subsequently, as illustrated in FIG. 4F, the pre-wet method rotates the substrate holder 220 by 180 degrees (turns upside down) using the rotation mechanism 240 such that the surface to be processed of the third substrate WF-3 held by the first holding member 222 is opposed to the deaerated liquid housed in the deaeration tank 210 (Rotation Step 121). Subsequently, the pre-wet method moves the first arm member 250-1 and the second arm member 250-2 of the substrate station 250 close to one another to the substrate holding positions, thus holding the second substrate WF-2 by the substrate station 250 (Step 122). Subsequently, the pre-wet method moves down the substrate holder 220 using the elevating mechanism 248 to immerse the third substrate WF-3 held by the first holding member 222 in the deaerated liquid housed in the deaeration tank 210, and performs the deaeration process (Third Deaeration Step 123). Subsequently, the pre-wet method unloads the second substrate WF-2 held by the substrate station 250 using the transfer device 700 (Step 124). The pre-wet method returns to Steps of FIG. 4C after Step 124, and repeatedly performs the preprocess on the subsequent substrates.

As described above, the pre-wet method of this embodiment is configured to concurrently perform the different processes (cleaning process and deaeration process) on the plurality of substrates in the pre-wet module 200. Therefore, according to this embodiment, the preprocess can be efficiently performed on the substrate, and the throughput of the pre-wet module 200 can be improved.

Figure 5:
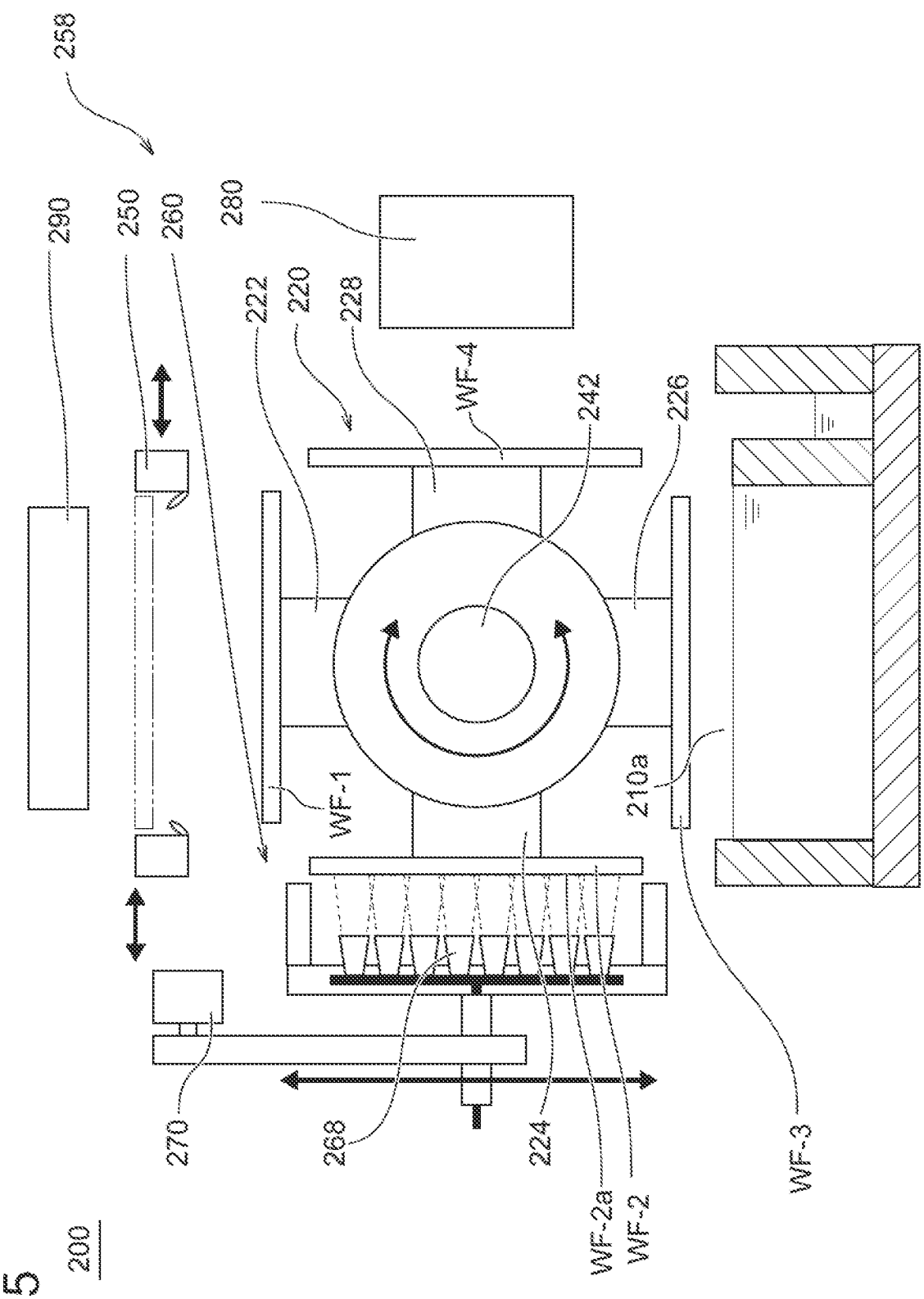
FIG. 5 is a vertical cross-sectional view schematically illustrating a configuration of a pre-wet module of another embodiment.

While the example in which the substrate holder 220 includes the first holding member 222 and the second holding member 224 has been described in the above-described embodiment, the configuration is not limited thereto. FIG. 5 is a vertical cross-sectional view schematically illustrating a configuration of a pre-wet module of another embodiment. For the configurations similar to those in the embodiment illustrated in FIG. 3, the explanations are omitted. As illustrated in FIG. 5, the substrate holder 220 includes the first holding member 222 for holding the first substrate WF-1, the second holding member 224 for holding the second substrate WF-2, a third holding member 226 for holding the third substrate WF-3, and a fourth holding member 228 for holding a fourth substrate WF-4.

The rotation mechanism not illustrated in FIG. 5 is configured to rotate the substrate holder 220 about the axis of the shaft 242. Thus, the rotation mechanism is configured to rotate the substrate holder 220 between a first state where the surface to be processed of the first substrate WF-1 is opposed to the deaerated liquid in the deaeration tank 210, a second state where the surface to be processed of the second substrate WF-2 is opposed to the deaerated liquid, a third state where the surface to be processed of the third substrate WF-3 is opposed to the deaerated liquid, and a fourth state where the surface to be processed of the fourth substrate WF-4 is opposed to the deaerated liquid. By moving up and down the substrate holder 220 by the elevating mechanism not illustrated in FIG. 5, the first substrate WF-1 to the fourth substrate WF-4 can be sequentially immersed in the deaerated liquid.

The first holding member 222 to the fourth holding member 228 are disposed at positions mutually shifted by 90 degrees about the axis of the shaft 242. In the state illustrated in FIG. 5, the first holding member 222 and the third holding member 226 are configured to hold the first substrate WF-1 and the third substrate WF-3 such that the surfaces to be processed of the first substrate WF-1 and the third substrate WF-3 face mutually opposite sides in the vertical direction. The second holding member 224 and the fourth holding member 228 are configured to hold the second substrate WF-2 and the fourth substrate WF-4 such that the surfaces to be processed of the second substrate WF-2 and the fourth substrate WF-4 face mutually opposite sides in the horizontal direction.

The pre-wet module 200 includes a processing device 258 configured such that when one of the first substrate WF-1 to the fourth substrate WF-4 is immersed in the deaerated liquid, the processing device 258 performs predetermined processes on other substrates. In the state illustrated in FIG. 5, the cleaning device 260 as one configuration of the processing device 258 is configured to supply the cleaning liquid to the second substrate WF-2 having the surface to be processed facing in the horizontal direction. Here, as illustrated in FIG. 5, the second holding member 224 is configured to hold the second substrate WF-2 such that the surface to be processed of this substrate is positioned outside the opening 210a formed in the upper portion of the deaeration tank 210 when the surface to be processed WF-2a of the second substrate WF-2 faces in the horizontal direction. Thus, since the cleaning liquid colliding with the surface to be processed of the second substrate WF-2 drops outside the deaeration tank 210, mixing of the cleaning liquid into the deaerated liquid can be suppressed. The same applies to the first holding member 222, the third holding member 226, and the fourth holding member 228. That is, when the first holding member 222, the third holding member 226, and the fourth holding member 228 are located at the same position as the second holding member 224 by the rotation of the substrate holder 220, the surfaces to be processed of the first substrate WF-1, the third substrate WF-3, and the fourth substrate WF-4 are positioned outside the opening 210a.

As illustrated in FIG. 5, the processing device 258 includes a drying device 280 configured to perform a drying process on the substrate (fourth substrate WF-4 in FIG. 5) having the surface to be processed facing in the horizontal direction. The drying device 280 is configured to dry the outer edge portion of the surface to be processed of the substrate after the deaeration process. By disposing the drying device 280, it can be suppressed that the power feeding contact point contacts the wet outer edge portion of the surface to be processed of the substrate in the subsequent plating process.

As illustrated in FIG. 5, the processing device 258 includes a surface reforming device 290 configured to perform a UV treatment or a plasma treatment on the substrate (first substrate WF-1 in FIG. 5) having the surface to be processed facing vertically upward. By disposing the surface reforming device 290, the surface to be processed of the substrate before the cleaning process and the deaeration process can be reformed to be hydrophilic.

According to this embodiment, in the pre-wet module 200, the surface reforming process, the cleaning process, the deaeration process, and the drying process can be concurrently performed on the plurality of substrates. Therefore, according to this embodiment, the preprocess can be efficiently performed on the substrate, thus allowing the improvement of the throughput of the pre-wet module 200.

Figure 6:
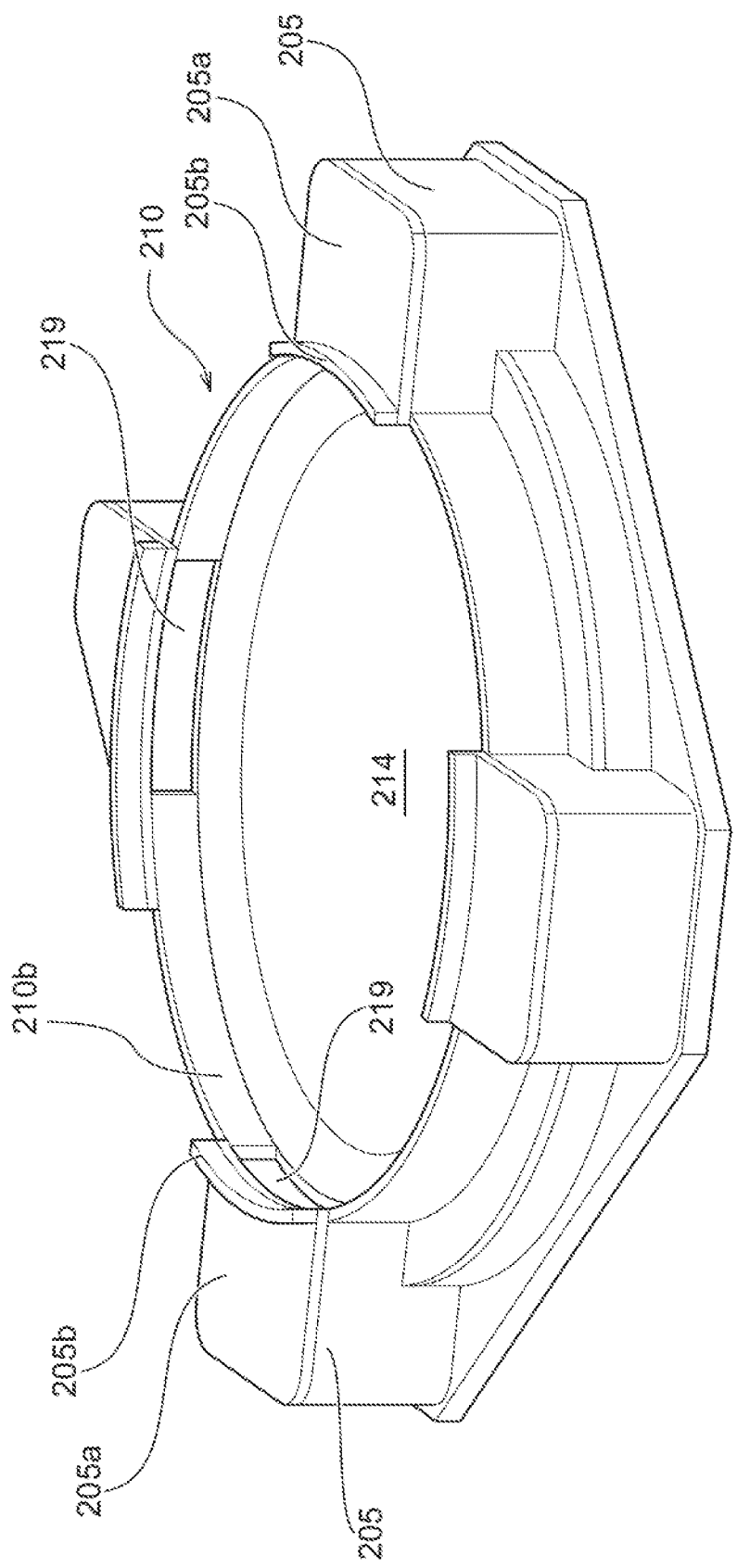
FIG. 6 is a perspective view schematically illustrating a configuration of a pre-wet module of one embodiment.
Figure 7:
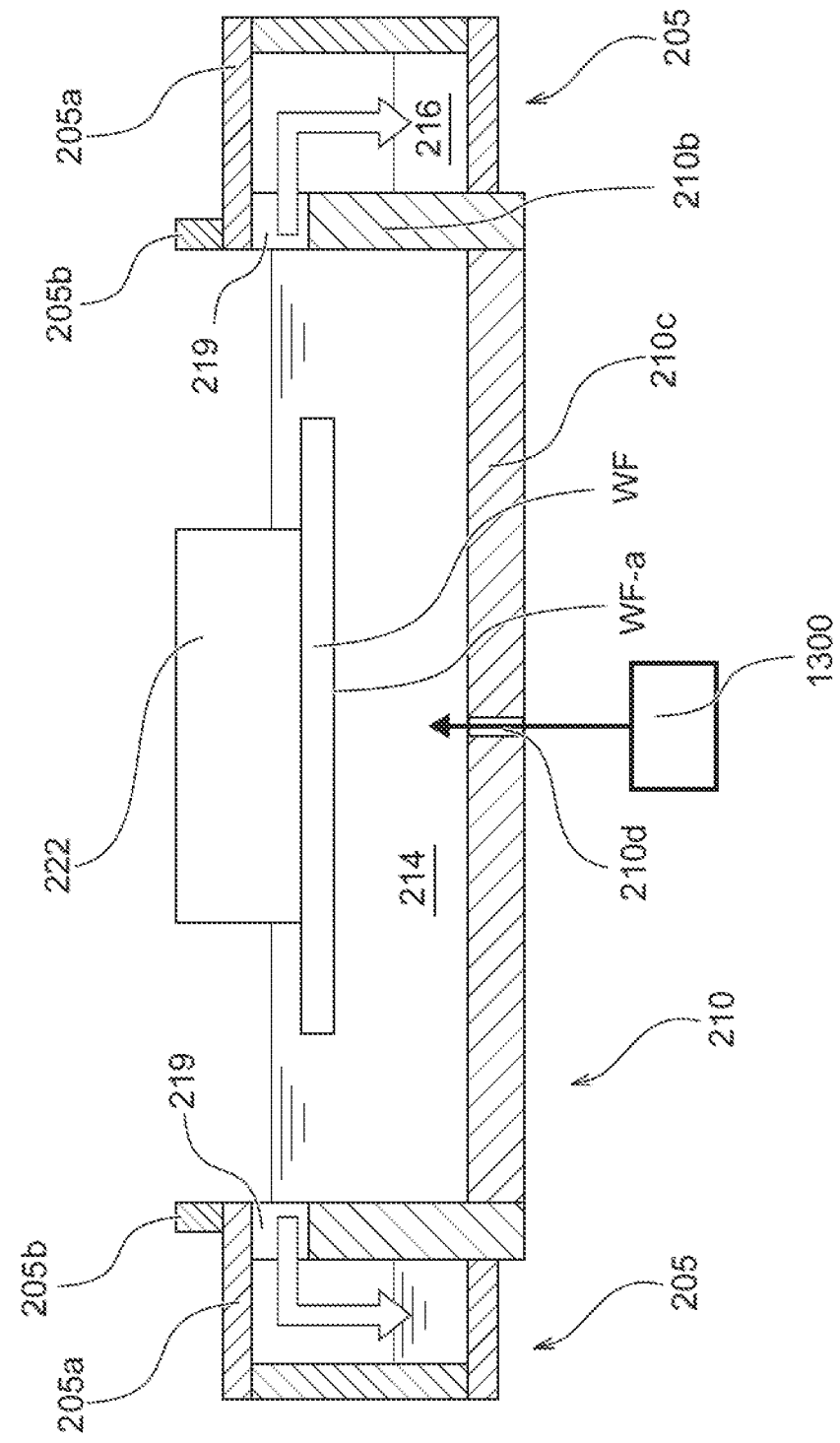
FIG. 7 is a vertical cross-sectional view schematically illustrating the configuration of the pre-wet module of the one embodiment.

Next, another embodiment of the pre-wet module will be described. While the example in which the space inside the deaeration tank 210 is partitioned into the deaeration region 214 and the overflow region 216 by the partition plate 212 has been described in the above-described embodiment, the configuration is not limited thereto. FIG. 6 is a perspective view schematically illustrating a configuration of a pre-wet module of one embodiment. FIG. 7 is a vertical cross-sectional view schematically illustrating the configuration of the pre-wet module of the one embodiment. Since the configuration excluding the deaeration tank 210 is similar to the configuration of the above-described embodiment, the explanation is omitted.

As illustrated in FIG. 6 and FIG. 7, the deaeration tank 210 has a plurality of (four in this embodiment) overflow ports 219 to allow the deaerated liquid to overflow from the approximately cylindrical-shaped deaeration tank 210 that houses the deaerated liquid. Specifically, the plurality of overflow ports 219 are formed along a circumferential direction at substantially regular intervals (intervals of about 90°) at the same height positions of a side wall 210$b$ of the deaeration tank 210. The plurality of overflow ports 219 are formed in the side wall 210$b$ of the deaeration tank 210 at the positions higher than the substrate WF immersed in the deaeration tank 210. The pre-wet module 200 includes a plurality of (four in this embodiment) overflow tanks 205 communicating with the respective plurality of overflow ports 219. The overflow tank 205 is an approximately rectangular container disposed outside the side wall 210$b$ of the deaeration tank 210. In this embodiment, the deaeration region 214 is formed inside the deaeration tank 210, and the overflow region 216 is formed inside the overflow tank 205.

As illustrated in FIG. 6 and FIG. 7, the deaeration tank 210 has an injection port 210$d$ for the deaerated liquid formed in the center of a bottom wall 210$c$ of the deaeration tank 210. The injection port 210$d$ is provided at a position corresponding to the center of the substrate WF immersed in the deaeration tank 210. The deaerated liquid delivered from a deaeration module 1300 configured to generate the deaerated liquid is injected into the deaeration tank 210 via the injection port 210$d$ to fill the deaeration tank 210, and overflows from the plurality of overflow ports 219.

As described in this embodiment, by allowing the deaerated liquid to overflow via the plurality of overflow ports 219, the flow rate of the deaerated liquid on the surface to be processed WF-a of the substrate WF can be equalized, and the amount of dissolved oxygen of the deaerated liquid in the deaeration tank 210 can be equalized.

That is, for example, when only one overflow port is formed, the deaerated liquid injected into the deaeration tank 210 via the injection port 210$d$ flows toward the center of the surface to be processed of the substrate WF, and then flows in a direction of the one overflow port. This makes the flow rate of the deaerated liquid on the surface to be processed of the substrate WF uneven, and causes stagnation of the flow of the deaerated liquid in a region on a side without the overflow port. Since the amount of dissolved oxygen increases due to air dissolved in the deaerated liquid from the liquid surface in the region in which the flow is stagnated, the amount of dissolved oxygen of the deaerated liquid in the deaeration tank 210 possibly becomes uneven. Consequently, since the deaeration process on the surface to be processed WF-a of the substrate WF becomes less likely to be promoted in the proximity of the region in which the flow is stagnated compared with the proximity of the region in which the flow is not stagnated, the variation of the deaeration process possibly occurs on the whole surface to be processed of the substrate WF.

In contrast, according to this embodiment, the deaerated liquid overflows from the plurality of overflow ports 219 arranged at substantially regular intervals in the circumferential direction of the side wall 210$b$ of the deaeration tank 210. Therefore, the deaerated liquid injected into the deaeration tank 210 via the injection port 210$d$ flows toward the center of the surface to be processed WF-a of the substrate WF, and then a flow radially expanding along the surface to be processed from the center of the surface to be processed of the substrate WF is formed. Accordingly, the flow rate of the deaerated liquid on the surface to be processed of the substrate WF can be more uniformed. Since the region in which the flow of the deaerated liquid is stagnated is less likely to be generated in the deaeration tank 210, the amount of dissolved oxygen of the deaerated liquid in the deaeration tank 210 can be more equalized, and consequently, the deaeration process can be more evenly performed on the whole surface to be processed WF-a of the substrate WF.

As illustrated in FIG. 6 and FIG. 7, the overflow tank 205 includes a plate-shaped lid member 205$a$ disposed to cover an opening at the top of the overflow tank 205. With the lid member 205$a$ included in the overflow tank 205, the cleaning liquid supplied from the plurality of nozzles 268 can be prevented from dropping in the overflow tank 205 (overflow region 216). Furthermore, the overflow tank 205 includes a plate member 205$b$ extending vertically upward from a position corresponding to the side wall 210$b$ of the deaeration tank 210 in an upper surface of the lid member 205$a$. By disposing the plate member 205$b$, even when the cleaning liquid supplied from the plurality of nozzles 268 drops on the lid member 205$a$ and then rebounds toward the deaeration tank 210, the cleaning liquid collides against the plate member 205$b$, thus allowing preventing the cleaning liquid from dropping in the deaeration tank 210.

Figure 8:
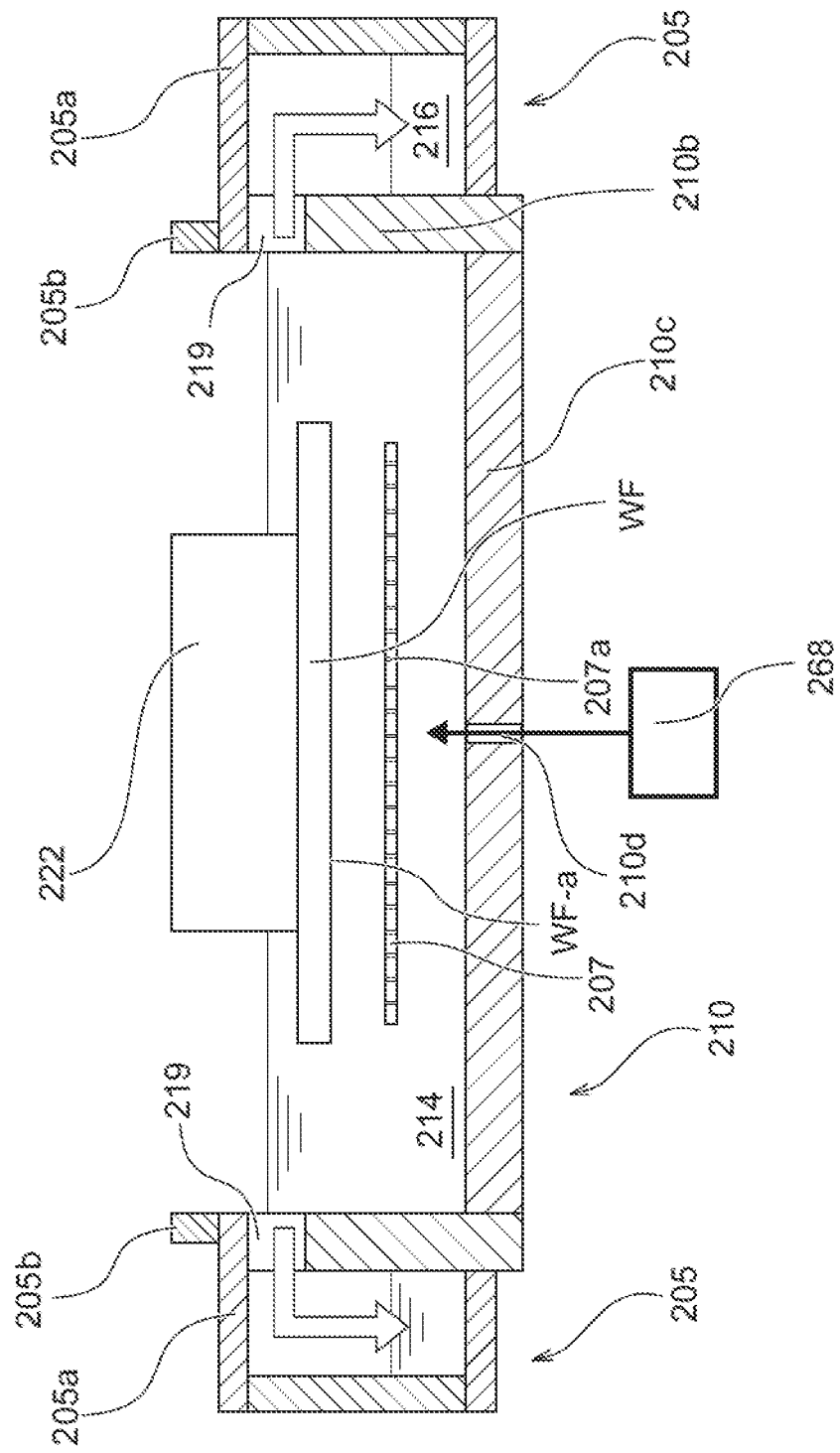
FIG. 8 is a vertical cross-sectional view schematically illustrating a configuration of a pre-wet module of one embodiment.
Figure 9:
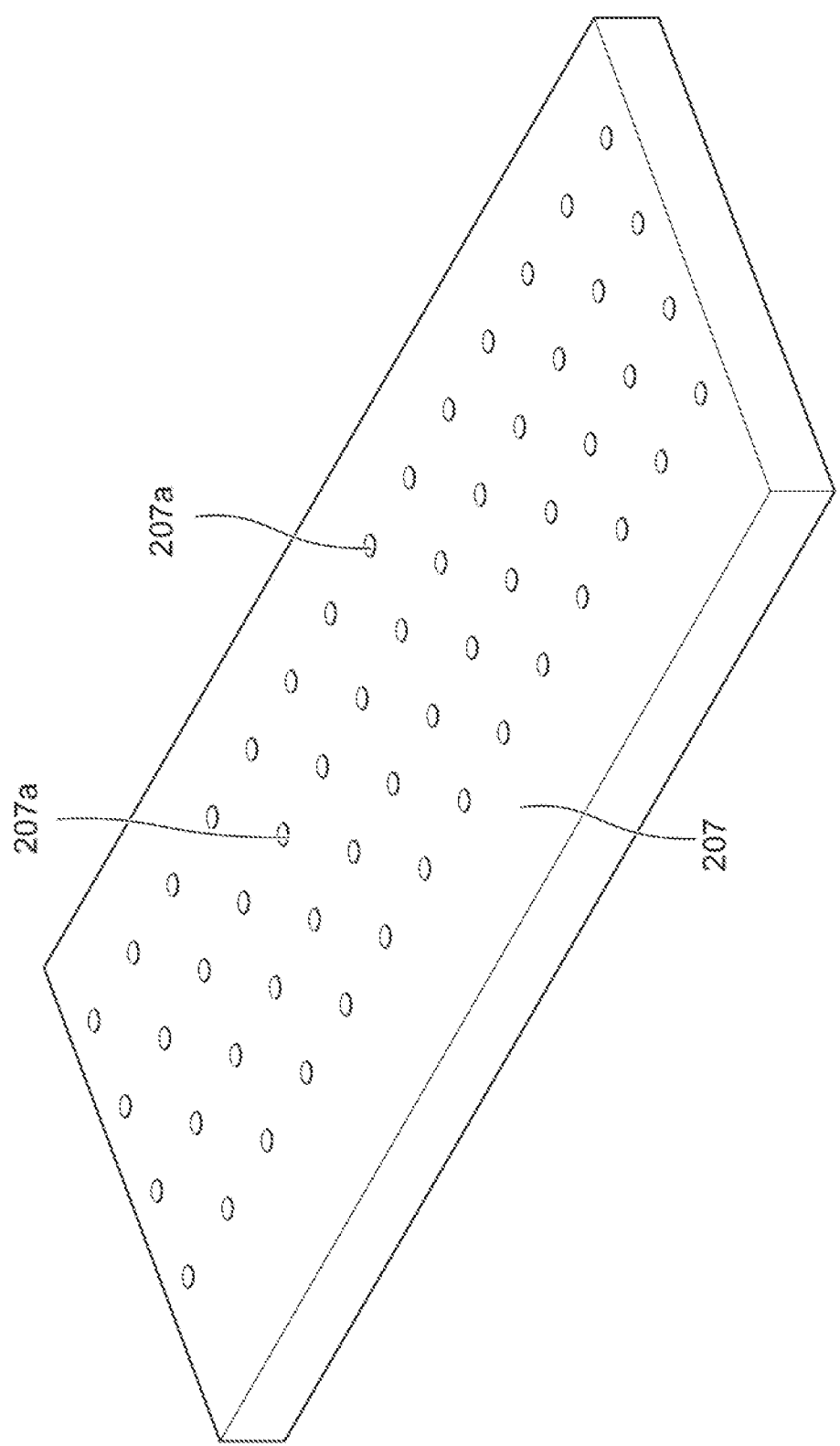
FIG. 9 is a perspective view illustrating an exemplary rectifier member.

FIG. 8 is a vertical cross-sectional view schematically illustrating a configuration of a pre-wet module of one embodiment. As illustrated in FIG. 8, the pre-wet module 200 includes a rectifier member 207 disposed between the substrate immersed in the deaeration tank 210 and the injection port 210$d$. FIG. 9 is a perspective view illustrating an exemplary rectifier member. As illustrated in FIG. 9, the rectifier member 207 is a plate-shaped member provided with a plurality of through-holes (circular holes) 207$a$.

For example, in the embodiment illustrated in FIG. 7, the deaerated liquid injected from the injection port 210$d$ flows more in a central portion than in an outer peripheral portion of the surface to be processed of the substrate WF, thus possibly making the deaeration process uneven. In contrast, in this embodiment, since the deaerated liquid injected from the injection port 210$d$ flows toward the surface to be processed of the substrate WF passing through the plurality of through-holes 207$a$ of the rectifier member 207, the deaerated liquid injected from the injection port 210$d$ can be more uniformly supplied to the whole surface to be processed of the substrate WF, and consequently, the deaeration process on the surface to be processed WF-a of the substrate WF can be more uniformed. While the rectifier member 207 provided with a plurality of circular holes 207$a$ has been described as an example in this embodiment, the rectifier member 207 is not limited thereto, and for example, square holes may be provided, or elongated holes may be provided by a drainboard-like configuration. It is only necessary that the rectifier member 207 is disposed between the substrate WF and the injection port 210d, and a plurality of through-holes opposed to the surface to be processed WF-a of the substrate WF are provided.

Figure 10:
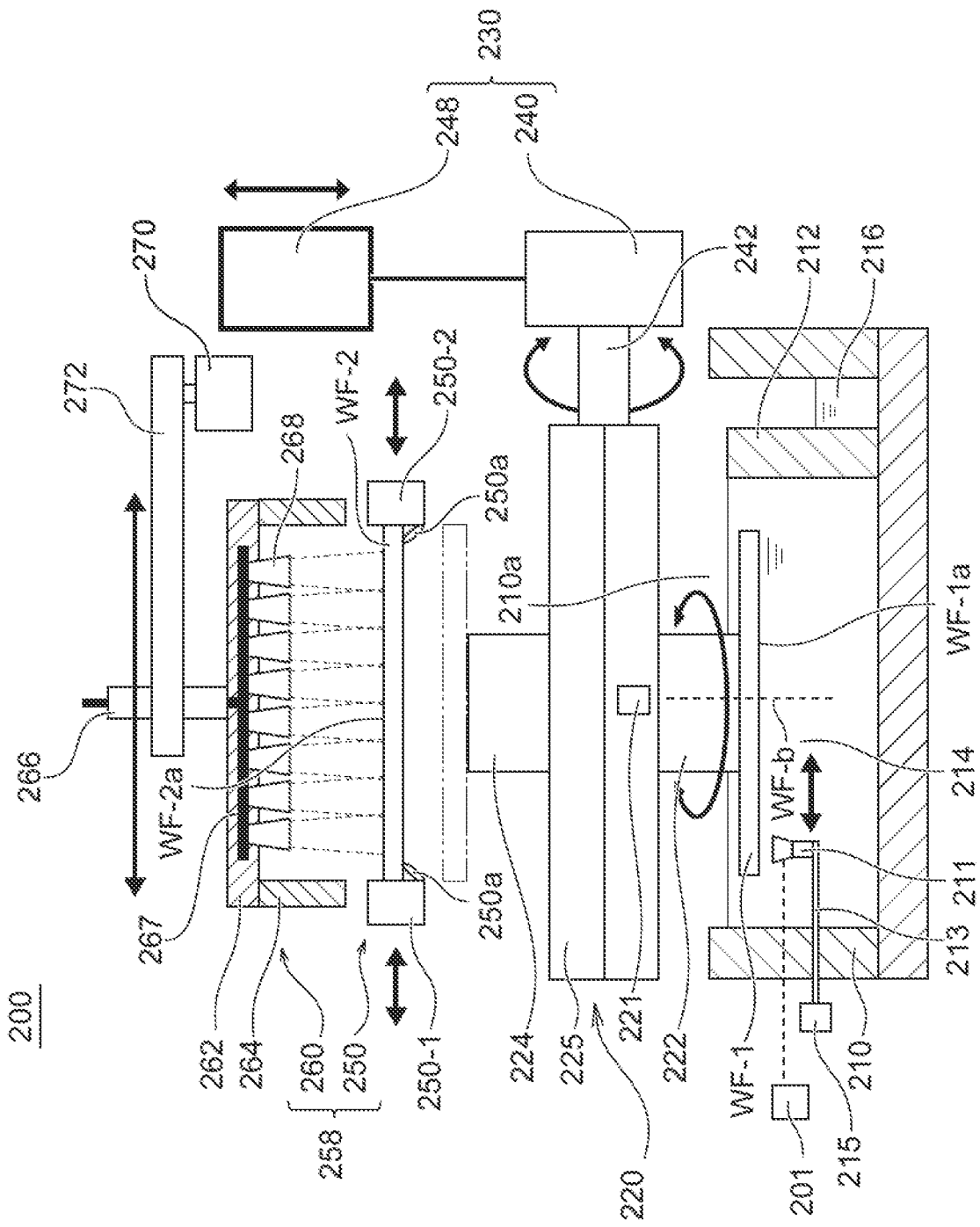
FIG. 10 is a vertical cross-sectional view schematically illustrating a configuration of a pre-wet module of one embodiment.

Next, another embodiment of the pre-wet module will be described. FIG. 10 is a vertical cross-sectional view schematically illustrating a configuration of a pre-wet module of one embodiment. The pre-wet module of this embodiment includes a plurality of additional members in addition to the configuration similar to that of the pre-wet module 200 described using FIG. 3. The explanation is omitted for the configuration similar to that of the pre-wet module 200 of FIG. 3.

As illustrated in FIG. 10, the pre-wet module 200 includes an imaging member (camera) 211 disposed to be opposed to the substrate immersed in the deaeration tank 210. An image taken by the imaging member 211 can be displayed on an output interface or the like of the control module 800. Therefore, an operator can observe a state of the surface to be processed of the substrate WF-1 immersed in the deaeration tank 210. The operator can monitor the state of the surface to be processed WF-1a, for example, whether air bubbles are accumulated on the surface to be processed of the substrate WF or not when the substrate WF-1 is immersed in the deaeration tank 210, or whether a failure has occurred on a seed layer during the deaeration process or not.

The pre-wet module 200 includes a determination device 201 configured to determine the deaeration state of the surface to be processed of the substrate. The determination device 201 is configured to determine the deaeration state of the surface to be processed of the substrate based on a luminance of the image taken by the imaging member 211. The determination device 201 can be configured by a general computer or dedicated computer in which a determination algorithm for the deaeration state is incorporated. The control module 800 of the plating apparatus 1000 may be used as the determination device 201.

Specifically, the determination device 201 can determine that the air bubbles are accumulated on the surface to be processed or the deaeration process has not been completed yet when the luminance of a part of a plurality of pixels included in the image taken by the imaging member 211, or an average luminance of the plurality of pixels exceeds a predetermined threshold. Meanwhile, the determination device 201 can determine that the deaeration process is completed when the luminance of a part of the plurality of pixels or the average luminance of the plurality of pixels becomes equal to or less than the predetermined threshold. That is, when the air bubbles are accumulated on the surface to be processed of the substrate WF, or when unsubstituted air remains between patterns or in vias of the surface to be processed, the taken image includes a white region of the air bubbles or air, thus increasing the luminance of the pixels. Accordingly, the determination device 201 can determine the deaeration state of the surface to be processed of the substrate based on the luminance of the taken image.

The imaging member 211 is mounted to a support table 213 and held in the deaeration tank 210. The pre-wet module 200 includes a drive member 215 for moving the imaging member 211 via the support table 213 in a direction along the surface to be processed of the substrate WF. The drive member 215 can be achieved by a known mechanism, such as a motor. By moving the imaging member by the drive member 215 along the surface to be processed of the substrate WF, the image of the surface to be processed can be taken along the radial direction of the substrate WF. For example, the imaging member 211 is preferably disposed at a distance of from 1 mm to 10 mm from the surface to be processed of the substrate.

The pre-wet module 200 further includes a rotation drive member 221 for rotating the first holding member 222 so as to rotate the substrate WF held by the substrate holder 220 about an axis WF-b passing through the center of the substrate. By rotating the substrate WF about the axis WF-b, the image of the surface to be processed can be taken along the circumferential direction of the substrate WF. By rotating the substrate WF using the rotation drive member 221 while moving the imaging member 211 using the drive member 215, the image of the whole surface to be processed can be taken. While the example in which the rotation drive member 221 for rotating the first holding member 222 is included has been described in this embodiment, the second holding member 224 may be similarly rotated. While the example in which a plurality of members such as the imaging member 211 are added to the pre-wet module 200 illustrated in FIG. 3 has been described in this embodiment, the configuration is not limited thereto, and the similar members may be added to the pre-wet module 200 illustrated in FIG. 5.

Next, another embodiment of the pre-wet module will be described. FIG. 11 is a vertical cross-sectional view schematically illustrating a configuration of a pre-wet module of one embodiment. The pre-wet module of this embodiment includes a plurality of additional members in addition to the configuration similar to that of the pre-wet module 200 described using FIG. 3. The explanation is omitted for the configuration similar to that of the pre-wet module 200 of FIG. 3.

As illustrated in FIG. 11, the pre-wet module 200 includes a stirring member (paddle) 217 disposed to be opposed to the substrate immersed in the deaeration tank 210. The pre-wet module 200 includes a drive member 218 for reciprocating the stirring member 217 along the surface to be processed of the substrate. The drive member 218 can be achieved by a known mechanism, such as a motor.

Figure 12A:
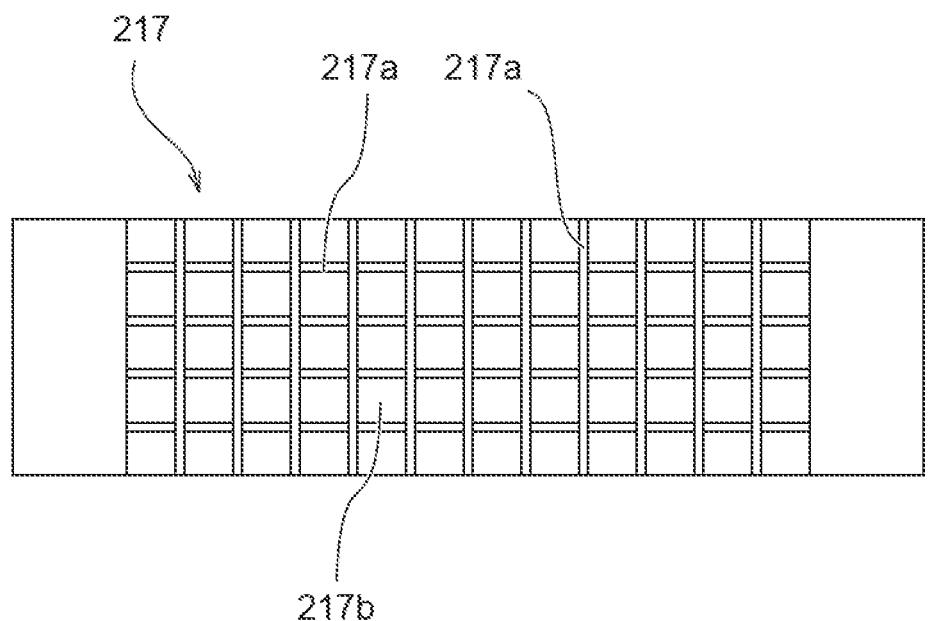
FIG. 12A is a plan view schematically illustrating a configuration of a stirring member.
Figure 12B:
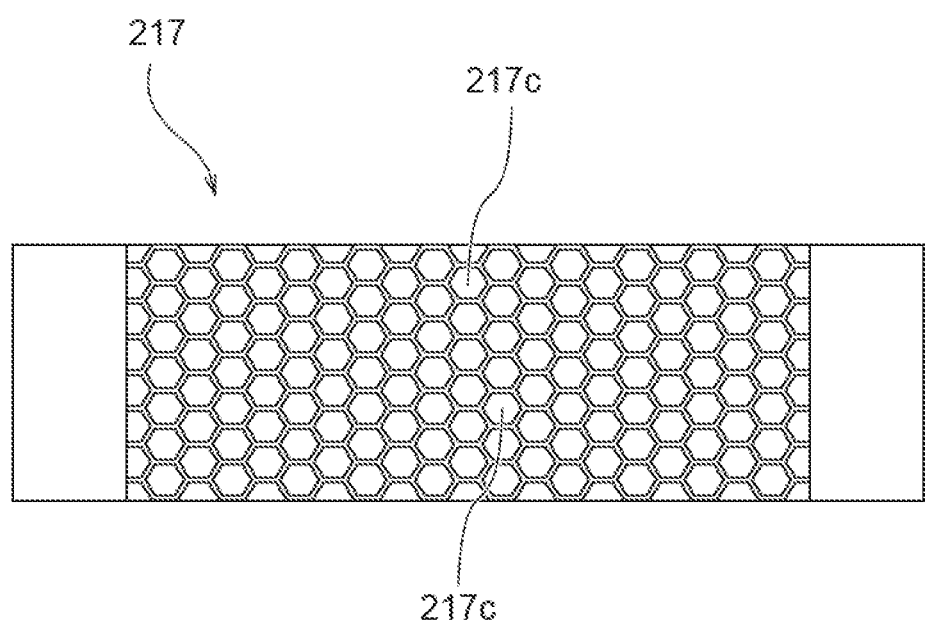
FIG. 12B is a plan view schematically illustrating a configuration of a stirring member.

FIG. 12A and FIG. 12B are plan views schematically illustrating a configuration of the stirring member. As illustrated in FIG. 12A, the stirring member 217 can be configured by a plate member provided with multiple holes 217b by arranging a plurality of rod-shaped members 217a in a grid pattern. As illustrated in FIG. 12B, the stirring member 217 also can be configured by a plate member provided with multiple holes 217c in a honeycomb pattern. By reciprocating the stirring member 217 by the drive member 218, the deaerated liquid in the proximity of the surface to be processed of the substrate WF can be stirred. Accordingly, for example, when the air inside the vias formed in the surface to be processed of the substrate WF is substituted with the deaerated liquid, since the deaerated liquid in which the air is dissolved can be removed from the vias, and the deaerated liquid in which the air is not dissolved can be newly delivered to the vias, the deaeration process can be promoted.

While the example in which the deaerated liquid is stirred by reciprocating the stirring member 217 has been described in this embodiment, the configuration is not limited thereto, and the deaerated liquid may be stirred by rotating the substrate WF using the rotation drive member 221 in the embodiment illustrated in FIG. 10. By reciprocating the stirring member 217 and by rotating the substrate WF using the rotation drive member 221, the deaerated liquid can be more strongly stirred.

Figure 13:
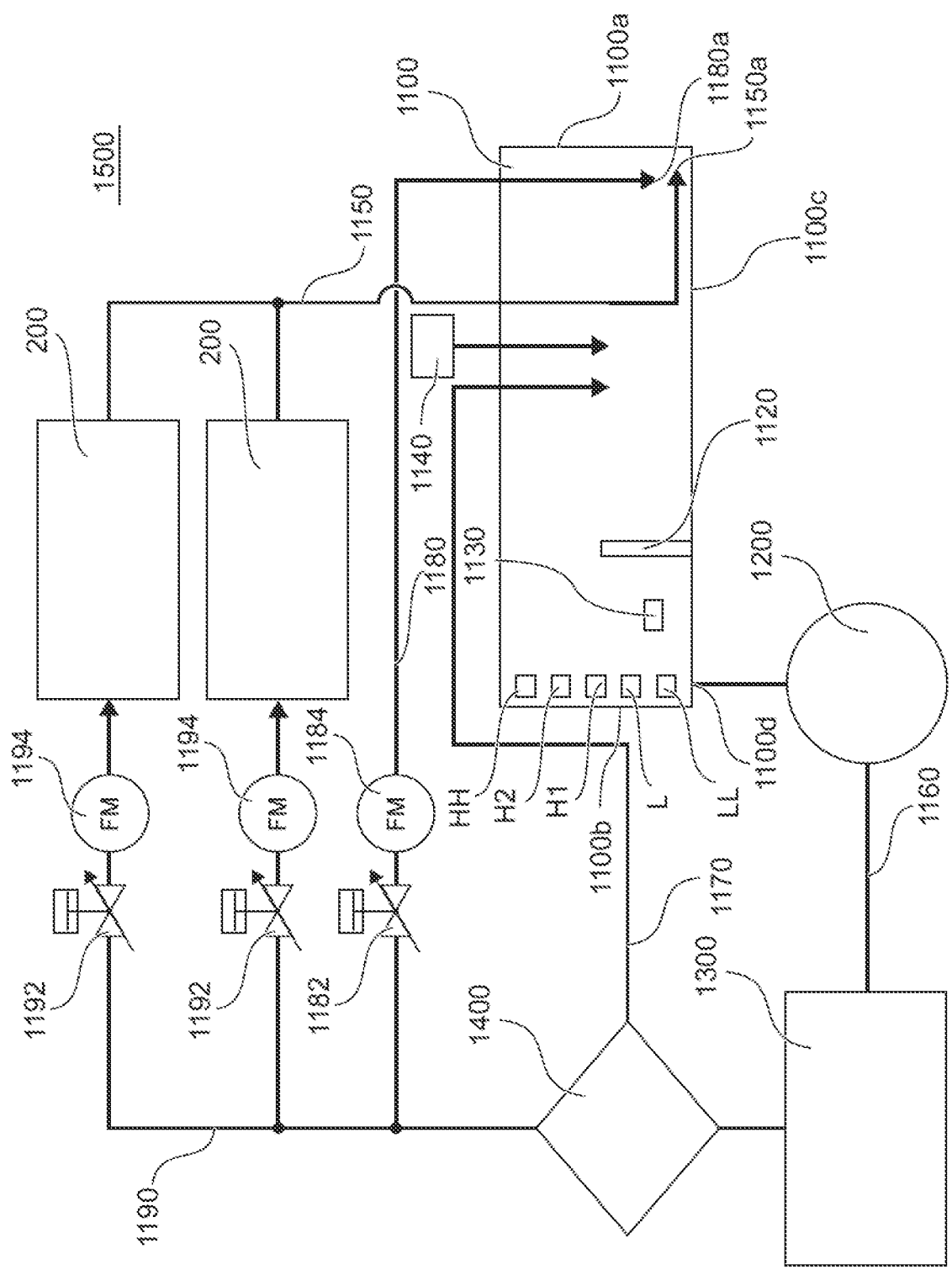
FIG. 13 is a drawing schematically illustrating a configuration of a deaerated liquid circulation system of one embodiment.

Next, a deaerated liquid circulation system including a plurality of the pre-wet modules 200 will be described. FIG. 13 is a drawing schematically illustrating a configuration of a deaerated liquid circulation system of one embodiment. As illustrated in FIG. 13, a deaerated liquid circulation system 1500 includes the two pre-wet modules 200 arranged in the vertical direction. The deaerated liquid circulation system 1500 includes one circulation tank 1100 disposed in common for the two pre-wet modules 200. The circulation tank 1100 is configured to receive the deaerated liquid overflowing from the two pre-wet modules 200. Specifically, the deaerated liquid overflowing from the two pre-wet modules 200 flows to the circulation tank 1100 via an overflow pipe 1150.

The deaerated liquid circulation system 1500 includes one deaeration module 1300 disposed in common for the two pre-wet modules 200. The deaeration module 1300 is a module for performing the deaeration process on the deaerated liquid, and configured to generate the deaerated liquid with a small amount of dissolved oxygen by vacuum drawing using a vacuum pump (not illustrated) or the like. The deaerated liquid circulation system 1500 includes one pressure-feeding member (pump) 1200 disposed in common for the two pre-wet modules 200. The pressure-feeding member 1200 is a member for pressure-feeding the deaerated liquid from the circulation tank 1100 to the two pre-wet modules 200 via the deaeration module 1300.

Specifically, the circulation tank 1100 is connected to the deaeration module 1300 via a discharge pipe 1160. The deaeration module 1300 is connected to the two pre-wet modules 200 via supply pipes 1190. The supply pipes 1190 connected to the two pre-wet modules 200 are each provided with a valve 1192 and a flowmeter 1194. When the valve 1192 is open, the pressure-feeding member 1200 pressure-feeds the deaerated liquid from the circulation tank 1100 to the deaeration module 1300 via the discharge pipe 1160, and pressure-feeds the deaerated liquid from the deaeration module 1300 to the two pre-wet modules 200 via the supply pipes 1190. According to this embodiment, since the circulation tank 1100, the deaeration module 1300, and the pressure-feeding member 1200 are used in common among a plurality of the pre-wet modules 200, the cost of the deaerated liquid circulation system 1500 can be reduced.

The deaerated liquid circulation system 1500 includes a filter 1400 disposed to the supply pipe 1190. The filter 1400 is a member for removing foreign objects included in the deaerated liquid flowing through the supply pipe 1190. A vent pipe 1170 for avoiding clogging of the filter 1400 is connected to the filter 1400. The vent pipe 1170 is connected to the circulation tank 1100, and the deaerated liquid flowing through the vent pipe 1170 is returned to the circulation tank 1100.

The deaerated liquid circulation system 1500 includes a bypass pipe 1180 branched from the supply pipe 1190 in a downstream side of the filter 1400 and connected to the circulation tank 1100. The bypass pipe 1180 includes a valve 1182 and a flowmeter 1184. This allows returning the deaerated liquid delivered from the deaeration module 1300 to the circulation tank 1100 without via the pre-wet modules 200.

The circulation tank 1100 has a first receiving port 1150a configured to receive the deaerated liquid overflowing from the two pre-wet modules in the circulation tank 1100. The first receiving port 1150a is formed at an end portion of the overflow pipe 1150 inserted into the circulation tank 1100. The circulation tank 1100 has a second receiving port 1180a configured to receive the deaerated liquid pressure-fed via the bypass pipe 1180 in the circulation tank 1100. The second receiving port 1180a is formed at an end portion of the bypass pipe 1180 inserted into the circulation tank 1100. The circulation tank 1100 has a discharge port 1100d for discharging the deaerated liquid in the circulation tank 1100 to the deaeration module 1300.

As illustrated in FIG. 13, the first receiving port 1150a and the second receiving port 1180a are provided in the proximity of a first side wall 1100a of the circulation tank 1100. More specifically, the first receiving port 1150a and the second receiving port 1180a are provided in the proximity of the first side wall 1100a and a bottom wall 1100c of the circulation tank 1100. The discharge port 1100d is provided to the bottom wall 1100c in the proximity of a second side wall 1100b opposed to the first side wall 1100a of the circulation tank 1100. Thus, by providing the first receiving port 1150a and the second receiving port 1180a at the positions opposite to the position at which the discharge port 1100d is provided in the circulation tank 1100, the deaerated liquid discharged from the pre-wet modules 200 and the deaerated liquid returned from the deaeration module 1300 can be mixed and then delivered to the deaeration module 1300.

Further, as illustrated in FIG. 13, the circulation tank 1100 includes a partition plate 1120 configured to partially partition between the first side wall 1100a and the second side wall 1100b. The partition plate 1120 is a plate member extending vertically upward from the bottom wall 1100c. By disposing the partition plate 1120, the deaerated liquid flowed in from the first receiving port 1150a and the second receiving port 1180a exceeds the partition plate 1120, and then flows toward the discharge port 1100d while being mixed together. Therefore, the deaerated liquid discharged from the pre-wet modules 200 and the deaerated liquid returned from the deaeration module 1300 can be sufficiently mixed together.

The circulation tank 1100 includes a dissolved oxygen meter 1130 disposed on a flow passage of the deaerated liquid that exceeds the partition plate 1120 and flows toward the discharge port 1100d. The dissolved oxygen meter 1130 is a sensor configured to measure the amount of dissolved oxygen in the deaerated liquid. For example, when the deaerated liquid circulation system 1500 is started up, by driving the pressure-feeding member 1200 while closing the valves 1192 and opening the valve 1182, the deaerated liquid circulation system 1500 circulates the deaerated liquid delivered from the deaeration module 1300 to the circulation tank 1100 without the pre-wet modules 200. Accordingly, the amount of dissolved oxygen in the deaerated liquid in the circulation tank 1100 decreases. When the amount of dissolved oxygen measured by the dissolved oxygen meter 1130 becomes lower than a predetermined threshold, the deaerated liquid circulation system 1500 opens the valves 1192, thereby allowing supplying the deaerated liquid that has been sufficiently deaerated to the pre-wet modules 200.

The circulation tank 1100 includes a plurality of (five in this embodiment) liquid level sensors HH, H2, H1, L, and LL for measuring a liquid surface level of the deaerated liquid in the circulation tank 1100. The liquid level sensors HH, H2, H1, L, and LL are disposed to be arranged in the vertical direction. The circulation tank 1100 is configured to be supplied with the deaerated liquid from a DIW supply source 1140. For example, when the liquid surface of the deaerated liquid in the circulation tank 1100 becomes lower than the liquid level sensor LL, the deaerated liquid circulation system 1500 stops the pressure-feeding member 1200 and replenishes the deaerated liquid from the DIW supply source 1140. When the liquid surface of the deaerated liquid in the circulation tank 1100 becomes higher than the liquid level sensor HH, the deaerated liquid circulation system 1500 stops the replenishment of the deaerated liquid from the DIW supply source 1140. The deaerated liquid circulation system 1500 adjusts a rotation speed of the pressure-feeding member 1200 or the replenishment amount of the deaerated liquid from the DIW supply source 1140 so as to have the liquid surface of the deaerated liquid in the circulation tank 1100 at the height between the liquid level sensors H2 and L (height of the liquid level sensor H1).

Figure 14:
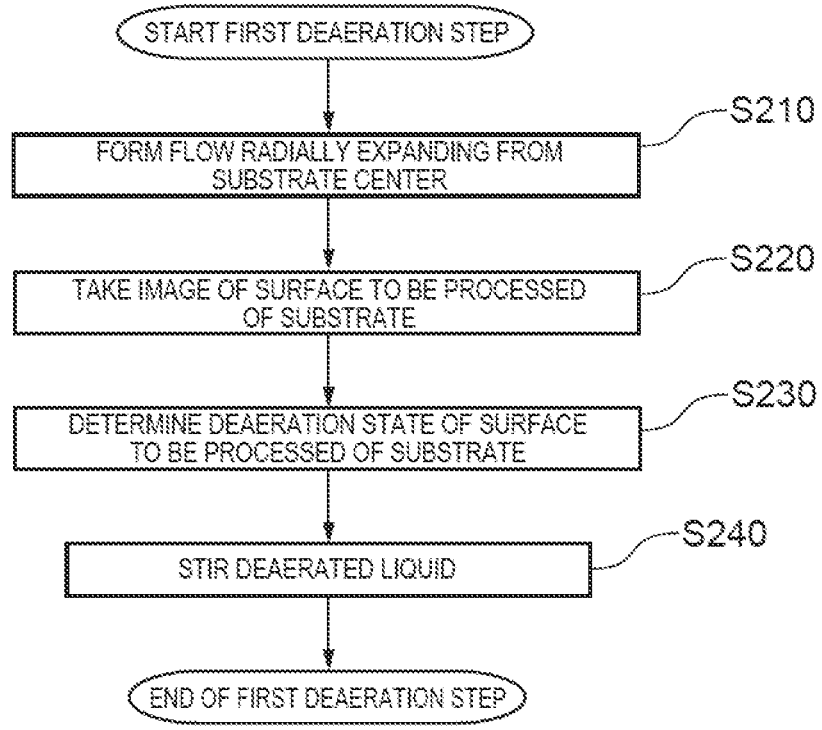
FIG. 14 is a flowchart illustrating a pre-wet method using a pre-wet module of one embodiment.

Next, a modification of the pre-wet method described using FIGS. 4A to 4F will be described. FIG. 14 is a flowchart illustrating a pre-wet method using a pre-wet module of one embodiment. FIG. 14 illustrates the additional steps concurrently performed with First Deaeration Step 107 in the pre-wet method of FIGS. 4A to 4F. Accordingly, the explanation is omitted for the steps similar to those in the pre-wet method of FIGS. 4A to 4F.

As illustrated in FIG. 14, at the same time as the start or after the start of First Deaeration Step 107, the pre-wet method forms the flow of the deaerated liquid radially expanding from the center of the surface to be processed of the substrate immersed in the deaerated liquid (Step 210). Step 210 is performed by, for example, allowing the deaerated liquid to overflow from the plurality of (four in this embodiment) overflow ports 219. That is, the deaerated liquid overflows from the plurality of overflow ports 219 provided at regular intervals in the circumferential direction of the side wall 210b of the deaeration tank 210, thereby forming the flow of the deaerated liquid, which is injected into the deaeration tank 210 via the injection port 210d, radially expanding from the center of the surface to be processed of the substrate WF along the surface to be processed. Accordingly, since the flow rate of the deaerated liquid on the surface to be processed of the substrate WF can be more uniformed, and the amount of dissolved oxygen of the deaerated liquid in the deaeration tank 210 can be more equalized, the deaeration process can be more evenly performed on the whole surface to be processed WF-a of the substrate WF.

Subsequently, the pre-wet method takes the image of the surface to be processed of the substrate immersed in the deaerated liquid at the same time as the start or after the start of First Deaeration Step 107 (Imaging Step 220). Imaging Step 220 takes the image of the surface to be processed of the substrate, for example, using the imaging member 211. Subsequently, the pre-wet method determines the deaeration state of the surface to be processed of the substrate based on the image taken in Imaging Step 220 (Determination Step 230). Determination Step 230 is performed by monitoring the state of the surface to be processed, for example, whether air bubbles are accumulated on the surface to be processed of the substrate or not, or whether a failure has occurred on a seed layer during the deaeration process or not, by the operator. Determination Step 230 may be performed by the determination device 201. In this case, the deaeration state of the surface to be processed of the substrate can be determined based on the luminance of the image taken by the imaging member 211.

Subsequently, the pre-wet method stirs the deaerated liquid housed in the deaeration tank 210 (Stirring Step 240). Stirring Step 240 is performed by, for example, reciprocating the stirring member 217 along the surface to be processed of the substrate. Stirring Step 240 can be performed by rotating the substrate WF using the rotation drive member 221. Accordingly, for example, when the air inside the vias formed in the surface to be processed of the substrate is substituted with the deaerated liquid, since the deaerated liquid in which the air is dissolved can be removed from the vias, and the deaerated liquid in which the air is not dissolved can be newly delivered to the vias, the deaeration process can be promoted.

While the example in which Step 210, Imaging Step 220 and Determination Step 230, and Stirring Step 240 are sequentially performed has been described in this embodiment, the order of performing these steps may be changed, or these steps may be simultaneously performed. All of these steps are not necessarily performed, and a part of these steps may be performed. While the example in which these steps are performed concurrently with First Deaeration Step 107 has been described in this embodiment, the configuration is not limited thereto, and these steps may be performed concurrently with Second Deaeration Step 115 or Third Deaeration Step 123.

While some embodiments of the present invention have been described above, the above-described embodiments of the invention are for ease of understanding the present invention, and are not for limiting the present invention. It is obvious that the present invention can be changed or improved without departing from its gist, and that the present invention encompasses its equivalents. Within a range that can solve at least a part of the above-described problems or a range that provides at least a part of the effects, any combination or omission of each component described in the claims and the description are allowed.

This application discloses, as one embodiment, a pre-wet module that includes a deaeration tank, a processing device, a substrate holder, and a drive mechanism. The deaeration tank is configured to house a deaerated liquid. The processing device includes a nozzle configured to supply a cleaning liquid to a surface to be processed of a substrate having the surface to be processed facing upward. The substrate holder is disposed between the deaeration tank and the processing device. The substrate holder includes a first holding member configured to hold a first substrate and a second holding member configured to hold a second substrate. The drive mechanism is configured to rotate and move up and down the substrate holder. The drive mechanism includes a rotation mechanism and an elevating mechanism. The rotation mechanism is configured to rotate the substrate holder between a first state where a surface to be processed of the first substrate is opposed to a deaerated liquid in the deaeration tank and a second state where a surface to be processed of the second substrate is opposed to the deaerated liquid in the deaeration tank. The elevating mechanism is configured to move up and down the substrate holder.

Furthermore, this application discloses, as one embodiment, the pre-wet module in which the nozzle of the processing device is configured such that when one of the first substrate and the second substrate is immersed in the deaerated liquid in the deaeration tank, the nozzle of the processing device supplies the cleaning liquid to the surface to be processed of the other substrate.

Furthermore, this application discloses, as one embodiment, the pre-wet module in which the first holding member and the second holding member are configured to hold the first substrate and the second substrate such that the surface to be processed of the first substrate and the surface to be processed of the second substrate face mutually opposite sides in a vertical direction, and the nozzle is configured to supply the cleaning liquid to the substrate held so as to have the surface to be processed facing upward in the vertical direction.

Furthermore, this application discloses, as one embodiment, the pre-wet module in which the substrate holder includes a shielding member having an outer edge larger than an opening formed in an upper portion of the deaeration tank, and the shielding member is configured to shield between the nozzle and the opening.

Furthermore, this application discloses, as one embodiment, a pre-wet module that includes a deaeration tank, a substrate holder, and a drive mechanism. The deaeration tank is configured to house a deaerated liquid. The substrate holder includes a first holding member configured to hold a first substrate, a second holding member configured to hold a second substrate, a third holding member configured to hold a third substrate, and a fourth holding member configured to hold a fourth substrate. The first holding member to the fourth holding member are configured to respectively hold the first substrate to the fourth substrate such that surfaces to be processed of the first substrate to the fourth substrate face mutually opposite sides in a vertical direction and mutually opposite sides in a horizontal direction. The drive mechanism is configured to rotate and move up and down the substrate holder. The drive mechanism includes a rotation mechanism and an elevating mechanism. The rotation mechanism is configured to rotate the substrate holder between a first state where a surface to be processed of the first substrate is opposed to a deaerated liquid in the deaeration tank, a second state where a surface to be processed of the second substrate is opposed to the deaerated liquid in the deaeration tank, a third state where a surface to be processed of the third substrate is opposed to the deaerated liquid in the deaeration tank, and a fourth state where a surface to be processed of the fourth substrate is opposed to the deaerated liquid in the deaeration tank. The elevating mechanism is configured to move up and down the substrate holder. The pre-wet module further includes a processing device configured such that when one of the first substrate to the fourth substrate is immersed in the deaerated liquid in the deaeration tank, the processing device performs a predetermined process on another substrate.

Furthermore, this application discloses, as one embodiment, the pre-wet module in which the first holding member to the fourth holding member are configured to respectively hold the first substrate to the fourth substrate such that the surface to be processed of a substrate among the first substrate to the fourth substrate is positioned outside an opening formed in an upper portion of the deaeration tank when the surface to be processed of the substrate faces in the horizontal direction, and the processing device includes a nozzle configured to supply a cleaning liquid to the surface to be processed of the substrate in a state where the surface to be processed faces in the horizontal direction.

Furthermore, this application discloses, as one embodiment, the pre-wet module in which the deaeration tank has a plurality of overflow ports for allowing the deaerated liquid to overflow from the deaeration tank, and the plurality of overflow ports are formed in a side wall of the deaeration tank along a circumferential direction at regular intervals.

Furthermore, this application discloses, as one embodiment, the pre-wet module in which the deaeration tank has an injection port for the deaerated liquid formed at a center of a bottom wall of the deaeration tank.

Furthermore, this application discloses, as one embodiment, the pre-wet module that further includes a rectifier member disposed between the substrate immersed in the deaeration tank and the injection port, and the rectifier member has a plurality of through-holes.

Furthermore, this application discloses, as one embodiment, the pre-wet module that further includes an imaging member disposed to be opposed to the substrate immersed in the deaeration tank, and a determination device configured to determine a deaeration state of the surface to be processed of the substrate in the deaeration tank based on a luminance of an image taken by the imaging member.

Furthermore, this application discloses, as one embodiment, the pre-wet module that further includes a drive member for moving the imaging member in a direction along the surface to be processed of the substrate.

Furthermore, this application discloses, as one embodiment, the pre-wet module that further includes a stirring member disposed to be opposed to the substrate immersed in the deaeration tank, and a drive member for reciprocating the stirring member along the surface to be processed of the substrate.

Furthermore, this application discloses, as one embodiment, the pre-wet module that further includes a rotation drive member for rotating at least one of the first holding member and the second holding member so as to rotate the substrate held by the substrate holder about an axis passing through a center of the substrate.

Furthermore, this application discloses, as one embodiment, a deaerated liquid circulation system that includes a plurality of the pre-wet modules according to any one of the above descriptions, a circulation tank, a deaeration module, a pressure-feeding member, and a bypass pipe. The circulation tank is disposed in common for the plurality of pre-wet modules. The circulation tank receives a deaerated liquid overflowing from the plurality of pre-wet modules. The deaeration module is disposed in common for the plurality of pre-wet modules. The deaeration module performs a deaeration process on the deaerated liquid. The pressure-feeding member is disposed in common for the plurality of pre-wet modules. The pressure-feeding member pressure-feeds the deaerated liquid from the circulation tank to the plurality of pre-wet modules via the deaeration module. The bypass pipe is branched from a pipe connecting between the deaeration module and the plurality of pre-wet modules. The bypass pipe is connected to the circulation tank.

Furthermore, this application discloses, as one embodiment, the deaerated liquid circulation system in which the circulation tank has a first receiving port, a second receiving port, and a discharge port, the first receiving port receives the deaerated liquid overflowing from the plurality of pre-wet modules in the circulation tank, the second receiving port receives the deaerated liquid pressure-fed via the bypass pipe in the circulation tank, the discharge port discharges the deaerated liquid in the circulation tank to the deaeration module, the first receiving port and the second receiving port are disposed in a proximity of a first side wall of the circulation tank, and the discharge port is disposed in a proximity of a second side wall opposed to the first side wall of the circulation tank.

Furthermore, this application discloses, as one embodiment, a pre-wet method that includes a first deaeration step of performing a deaeration process by positioning a first substrate at a first position and immersing a surface to be processed of the first substrate downwardly in the deaerated liquid, a first cleaning step of supplying a cleaning liquid to a surface to be processed of a second substrate in a state where the second substrate is positioned at a second position and the surface to be processed of the second substrate faces upward concurrently with performing of the first deaeration step, a rotation step of rotating the first substrate and the second substrate to position the second substrate at the first position after the first deaeration step and the first cleaning step, a second deaeration step of performing a deaeration process by immersing the surface to be processed of the second substrate downwardly in the deaerated liquid after the rotation step, and a second cleaning step of supplying a cleaning liquid to a surface to be processed of a third substrate in a state where the surface to be processed of the third substrate faces upward at the second position concurrently with performing of the second deaeration step.

Furthermore, this application discloses, as one embodiment, the pre-wet method that further includes a step of forming a flow of the deaerated liquid radially expanding from a center of the surface to be processed of the substrate immersed in the deaerated liquid concurrently with performing of the first deaeration step or the second deaeration step.

Furthermore, this application discloses, as one embodiment, the pre-wet method that further includes an imaging step of taking an image of the surface to be processed of the substrate immersed in the deaerated liquid concurrently with performing of the first deaeration step or the second deaeration step, and a determination step of determining a deaeration state of the surface to be processed of the substrate based on the image taken in the imaging step.

Furthermore, this application discloses, as one embodiment, the pre-wet method that further includes a stirring step of stirring the deaerated liquid concurrently with performing of the first deaeration step or the second deaeration step.

REFERENCE SIGNS LIST

200 . . . pre-wet module
201 . . . determination device
205 . . . overflow tank
207 . . . rectifier member
207a . . . through-hole (circular hole)
210 . . . deaeration tank
210a . . . opening
210b . . . side wall
210c . . . bottom wall
210d . . . injection port
211 . . . imaging member (camera)
215 . . . drive member
217 . . . stirring member (paddle)
218 . . . drive member
219 . . . overflow port
220 . . . substrate holder
221 . . . rotation drive member
222 . . . first holding member
224 . . . second holding member
225 . . . shielding member
226 . . . third holding member
228 . . . fourth holding member
230 . . . drive mechanism
240 . . . rotation mechanism
248 . . . elevating mechanism
250 . . . substrate station
250-1 . . . first arm member
250-2 . . . second arm member
260 . . . cleaning device
268 . . . nozzle
280 . . . drying device
290 . . . surface reforming device
1000 . . . plating apparatus
1100 . . . circulation tank
1100a . . . first side wall
1100b . . . second side wall
1100c . . . bottom wall
1100d . . . discharge port
1150a . . . first receiving port
1180 . . . bypass pipe
1180a . . . second receiving port
1200 . . . pressure-feeding member (pump)
1300 . . . deaeration module
1500 . . . deaerated liquid circulation system
WF . . . substrate
WF-1 . . . first substrate
WF-2 . . . second substrate
WF-3 . . . third substrate
WF-4 . . . fourth substrate

What is claimed is:

1. A pre-wet module comprising:
a deaeration tank configured to house a deaerated liquid;
a processing device that includes a nozzle configured to supply a cleaning liquid to a surface to be processed of a substrate having the surface to be processed facing upward;
a substrate holder disposed between the deaeration tank and the processing device, the substrate holder including a first holding member configured to hold a first substrate and a second holding member configured to hold a second substrate; and
a drive mechanism configured to rotate and move up and down the substrate holder, wherein
the drive mechanism includes:
a rotation mechanism configured to rotate the substrate holder between a first state where a surface to be processed of the first substrate is opposed to a deaerated liquid in the deaeration tank and a second state where a surface to be processed of the second substrate is opposed to the deaerated liquid in the deaeration tank; and
an elevating mechanism configured to move up and down the substrate holder.

2. The pre-wet module according to claim 1, wherein the nozzle of the processing device is configured such that when one of the first substrate and the second substrate is immersed in the deaerated liquid in the deaeration tank, the nozzle of the processing device supplies the cleaning liquid to the surface to be processed of the other substrate.

3. The pre-wet module according to claim 1, wherein the first holding member and the second holding member are configured to hold the first substrate and the second substrate such that the surface to be processed of the first substrate and the surface to be processed of the second substrate face mutually opposite sides in a vertical direction, and
the nozzle is configured to supply the cleaning liquid to the substrate held so as to have the surface to be processed facing upward in the vertical direction.

4. The pre-wet module according to claim 1, wherein the substrate holder includes a shielding member having an outer edge larger than an opening formed in an upper portion of the deaeration tank, and the shielding member is configured to shield between the nozzle and the opening.

5. A pre-wet module comprising:
a deaeration tank configured to house a deaerated liquid;
a substrate holder that includes a first holding member configured to hold a first substrate, a second holding member configured to hold a second substrate, a third holding member configured to hold a third substrate, and a fourth holding member configured to hold a fourth substrate, the first holding member to the fourth holding member being configured to respectively hold the first substrate to the fourth substrate such that surfaces to be processed of the first substrate to the fourth substrate face mutually opposite sides in a vertical direction and mutually opposite sides in a horizontal direction; and a drive mechanism configured to rotate and move up and down the substrate holder, wherein the drive mechanism includes:

a rotation mechanism configured to rotate the substrate holder between a first state where a surface to be processed of the first substrate is opposed to a deaerated liquid in the deaeration tank, a second state where a surface to be processed of the second substrate is opposed to the deaerated liquid in the deaeration tank, a third state where a surface to be processed of the third substrate is opposed to the deaerated liquid in the deaeration tank, and a fourth state where a surface to be processed of the fourth substrate is opposed to the deaerated liquid in the deaeration tank; and an elevating mechanism configured to move up and down the substrate holder, and the pre-wet module further includes a processing device configured such that when one of the first substrate to the fourth substrate is immersed in the deaerated liquid in the deaeration tank, the processing device performs a predetermined process on another substrate.

6. The pre-wet module according to claim 5, wherein the first holding member to the fourth holding member are configured to respectively hold the first substrate to the fourth substrate such that the surface to be processed of a substrate among the first substrate to the fourth substrate is positioned outside an opening formed in an upper portion of the deaeration tank when the surface to be processed of the substrate faces in the horizontal direction, and the processing device includes a nozzle configured to supply a cleaning liquid to the surface to be processed of the substrate in a state where the surface to be processed faces in the horizontal direction.

7. The pre-wet module according to claim 1, wherein the deaeration tank has a plurality of overflow ports for allowing the deaerated liquid to overflow from the deaeration tank, and the plurality of overflow ports are formed in a side wall of the deaeration tank along a circumferential direction at regular intervals.

8. The pre-wet module according to claim 1, wherein the deaeration tank has an injection port for the deaerated liquid formed at a center of a bottom wall of the deaeration tank.

9. The pre-wet module according to claim 8, further comprising
a rectifier member disposed between the substrate immersed in the deaeration tank and the injection port, the rectifier member having a plurality of through-holes.

10. The pre-wet module according to claim 1, further comprising:
an imaging member disposed to be opposed to the substrate immersed in the deaeration tank; and
a determination device configured to determine a deaeration state of the surface to be processed of the substrate in the deaeration tank based on a luminance of an image taken by the imaging member.

11. The pre-wet module according to claim 10, further comprising
a drive member for moving the imaging member in a direction along the surface to be processed of the substrate.

12. The pre-wet module according to claim 1, further comprising:
a stirring member disposed to be opposed to the substrate immersed in the deaeration tank; and
a drive member for reciprocating the stirring member along the surface to be processed of the substrate.

13. The pre-wet module according to claim 1, further comprising
a rotation drive member for rotating at least one of the first holding member and the second holding member so as to rotate the substrate held by the substrate holder about an axis passing through a center of the substrate.

14. A deaerated liquid circulation system comprising:
a plurality of the pre-wet modules according to claim 1;
a circulation tank disposed in common for the plurality of pre-wet modules, the circulation tank receiving a deaerated liquid overflowing from the plurality of pre-wet modules;
a deaeration module disposed in common for the plurality of pre-wet modules, the deaeration module being configured to perform a deaeration process on the deaerated liquid;
a pressure-feeding member disposed in common for the plurality of pre-wet modules, the pressure-feeding member being configured to pressure-feed the deaerated liquid from the circulation tank to the plurality of pre-wet modules via the deaeration module; and
a bypass pipe branched from a pipe connecting between the deaeration module and the plurality of pre-wet modules, the bypass pipe being connected to the circulation tank.

* * * * *